(12) United States Patent
Nakai et al.

(10) Patent No.: US 9,136,468 B2
(45) Date of Patent: Sep. 15, 2015

(54) NONVOLATILE SEMICONDUCTOR MEMORY DEVICE

(71) Applicant: KABUSHIKI KAISHA TOSHIBA, Tokyo (JP)

(72) Inventors: Tsukasa Nakai, Hino (JP); Masaki Kondo, Kawasaki (JP); Hiroyoshi Tanimoto, Yokohama (JP); Nobutoshi Aoki, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 233 days.

(21) Appl. No.: 13/959,493

(22) Filed: Aug. 5, 2013

(65) Prior Publication Data
US 2014/0241050 A1 Aug. 28, 2014

(30) Foreign Application Priority Data
Feb. 27, 2013 (JP) ................... 2013-036948

(51) Int. Cl.
*G11C 13/00* (2006.01)
*H01L 45/00* (2006.01)
*H01L 27/24* (2006.01)

(52) U.S. Cl.
CPC .............. *H01L 45/06* (2013.01); *G11C 13/003* (2013.01); *G11C 13/0004* (2013.01); *H01L 27/2409* (2013.01); *H01L 27/2481* (2013.01); *H01L 45/12* (2013.01); *H01L 45/126* (2013.01); *H01L 45/144* (2013.01); *G11C 2213/71* (2013.01); *G11C 2213/72* (2013.01); *G11C 2213/73* (2013.01); *G11C 2213/74* (2013.01); *G11C 2213/79* (2013.01)

(58) Field of Classification Search
CPC ............ G11C 13/0004; G11C 13/003; G11C 2213/71; G11C 2213/72; G11C 2213/74; G11C 2213/79; G11C 2213/73; H01L 27/2409; H01L 27/2481; H01L 45/06; H01L 45/12; H01L 45/126; H01L 45/144
See application file for complete search history.

(56) References Cited

U.S. PATENT DOCUMENTS

| 5,536,947 A | 7/1996 | Klersy et al. |
| 6,804,137 B1 * | 10/2004 | Yeh et al. ................... 365/106 |

(Continued)

FOREIGN PATENT DOCUMENTS

| JP | 2010287744 A | 12/2010 |
| JP | 2011228522 A | 11/2011 |

OTHER PUBLICATIONS

Kolobov A. V. et al.: "Understanding the phase-change mechanism of rewritable optical media", Sep. 12, 2004, Nature Materials, vol. 3, Oct. 2004, pp. 703-708 (in English).

(Continued)

*Primary Examiner* — Vanthu Nguyen
*Assistant Examiner* — Khamdan Alrobaie
(74) *Attorney, Agent, or Firm* — Holtz, Holtz, Goodman & Chick PC

(57) ABSTRACT

According to one embodiment, a nonvolatile semiconductor memory device includes a memory cell which stores data with two or more levels. The memory cell includes a structure includes a first electrode layer, a first semiconductor layer, a phase change film, an electrical insulating layer, a second semiconductor layer, and a second electrode layer arranged in order thereof, and the first semiconductor layer and the second semiconductor layer have carrier polarities different from each other.

20 Claims, 24 Drawing Sheets

(56) References Cited

U.S. PATENT DOCUMENTS

| | | |
|---|---|---|
| 8,681,531 B2 * | 3/2014 | Liu et al. .................. 365/148 |
| 2004/0234895 A1 | 11/2004 | Lee et al. |
| 2007/0108488 A1 * | 5/2007 | Suh et al. .................. 257/295 |
| 2010/0200828 A1 | 8/2010 | Tominaga et al. |
| 2010/0315867 A1 | 12/2010 | Aizawa et al. |
| 2011/0260131 A1 | 10/2011 | Sonehara |

OTHER PUBLICATIONS

Japanese Office Action (and English translation thereof) dated Apr. 14, 2015, issued in counterpart Japanese Application No. 2013-036948.

* cited by examiner

<PCRAM>
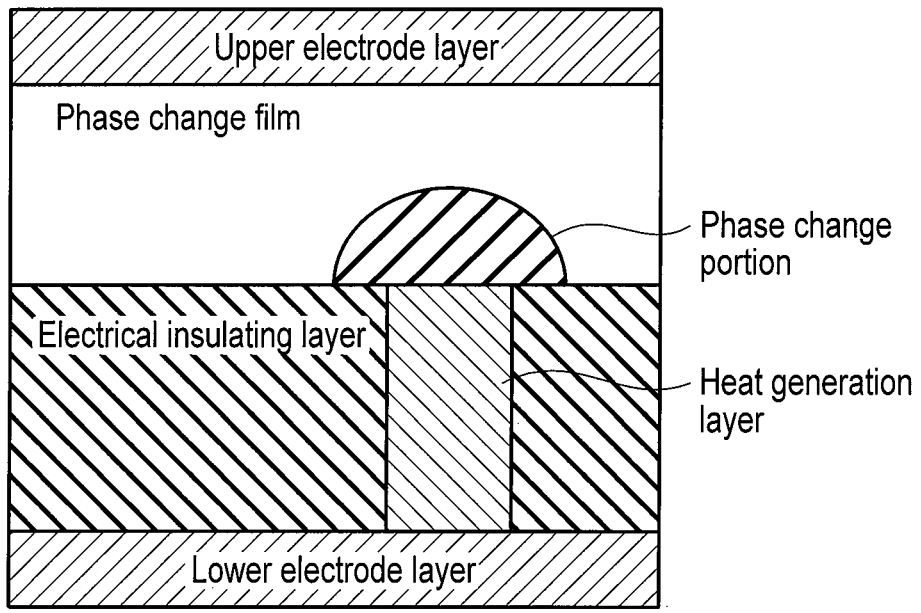
F I G. 1
<SIS diode>
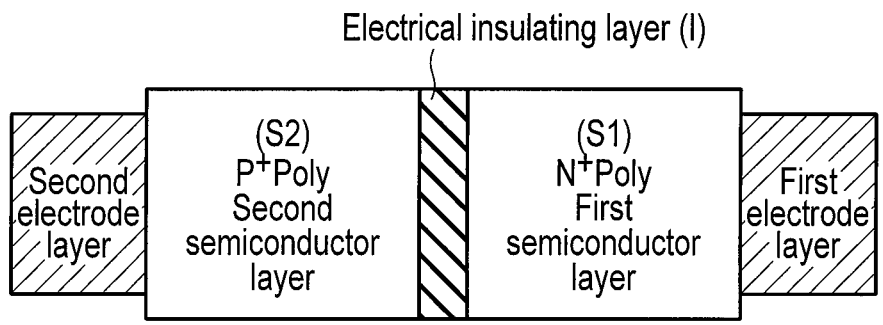
F I G. 2

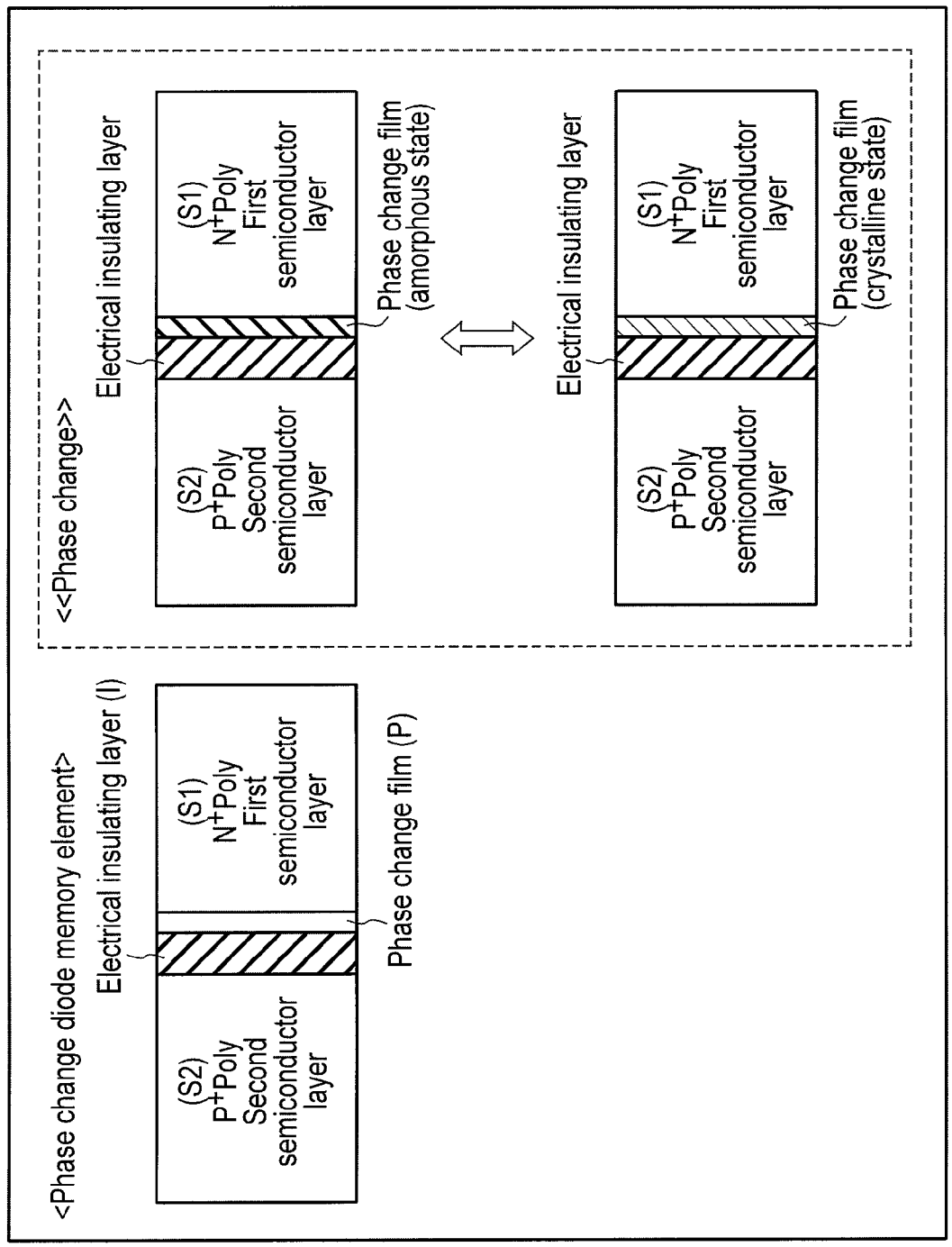
F I G. 5

| No. | Activation concentration of semiconductor layer [cm$^{-3}$] | | Film thickness of semiconductor layer [nm] | | Film thickness of electrical insulating layer SiO2 [nm] | ON/OFF ratio of memory element |
|---|---|---|---|---|---|---|
| | First | Second | First | Second | | |
| 1 | $1 \times 10^{20}$ | $1 \times 10^{20}$ | 10 | 10 | 1.5 | $1 \times 10^3$ or more |
| 2 | $1 \times 10^{20}$ | $1 \times 10^{20}$ | 10 | 30 | 1.5 | $1 \times 10^3$ or more |
| 3 | $1 \times 10^{20}$ | $1 \times 10^{20}$ | 10 | 10 | 0.5 | $1 \times 10^3$ or more |
| 4 | $1 \times 10^{20}$ | $1 \times 10^{20}$ | 30 | 30 | 0.5 | $1 \times 10^3$ or more |
| 5 | $1 \times 10^{20}$ | $1 \times 10^{20}$ | 10 | 30 | 0.5 | $1 \times 10^3$ or more |
| 6 | $1 \times 10^{20}$ | $1 \times 10^{20}$ | 10 | 10 | 3 | $1 \times 10^3$ or more |
| 7 | $1 \times 10^{20}$ | $1 \times 10^{20}$ | 30 | 30 | 3 | $1 \times 10^3$ or more |
| 8 | $1 \times 10^{20}$ | $1 \times 10^{20}$ | 10 | 30 | 3 | $1 \times 10^3$ or more |
| 9 | $1 \times 10^{21}$ | $1 \times 10^{21}$ | 10 | 10 | 1.5 | $1 \times 10^3$ or more |
| 10 | $1 \times 10^{21}$ | $1 \times 10^{21}$ | 30 | 30 | 1.5 | $1 \times 10^3$ or more |
| 11 | $1 \times 10^{21}$ | $1 \times 10^{21}$ | 10 | 30 | 1.5 | $1 \times 10^3$ or more |
| 12 | $1 \times 10^{21}$ | $1 \times 10^{21}$ | 10 | 10 | 0.5 | $1 \times 10^3$ or more |
| 13 | $1 \times 10^{21}$ | $1 \times 10^{21}$ | 30 | 30 | 0.5 | $1 \times 10^3$ or more |
| 14 | $1 \times 10^{21}$ | $1 \times 10^{21}$ | 10 | 30 | 0.5 | $1 \times 10^3$ or more |
| 15 | $1 \times 10^{21}$ | $1 \times 10^{21}$ | 10 | 10 | 3 | $1 \times 10^3$ or more |
| 16 | $1 \times 10^{21}$ | $1 \times 10^{21}$ | 30 | 30 | 3 | $1 \times 10^3$ or more |
| 17 | $1 \times 10^{21}$ | $1 \times 10^{21}$ | 10 | 30 | 3 | $1 \times 10^3$ or more |

FIG. 12

| No. | Film thickness of phase change film [nm] | | ON/OFF ratio of memory element |
| --- | --- | --- | --- |
| 1 | 1 | GeTe | $1 \times 10^3$ or more |
| 2 | 1.5 | GeTe | $1 \times 10^3$ or more |
| 3 | 2 | GeTe | $1 \times 10^3$ or more |
| 4 | 5 | GeTe | $1 \times 10^3$ or more |
| 5 | 10 | $Ge_2Sb_2Te_5$ | $1 \times 10^3$ or more |
| 6 | 20 | $Ge_2Sb_2Te_5$ | $1 \times 10^3$ or more |
| 7 | 40 | Stacked film of $GeTe/Sb_2Te_3$ | $1 \times 10^3$ or more |

FIG. 13

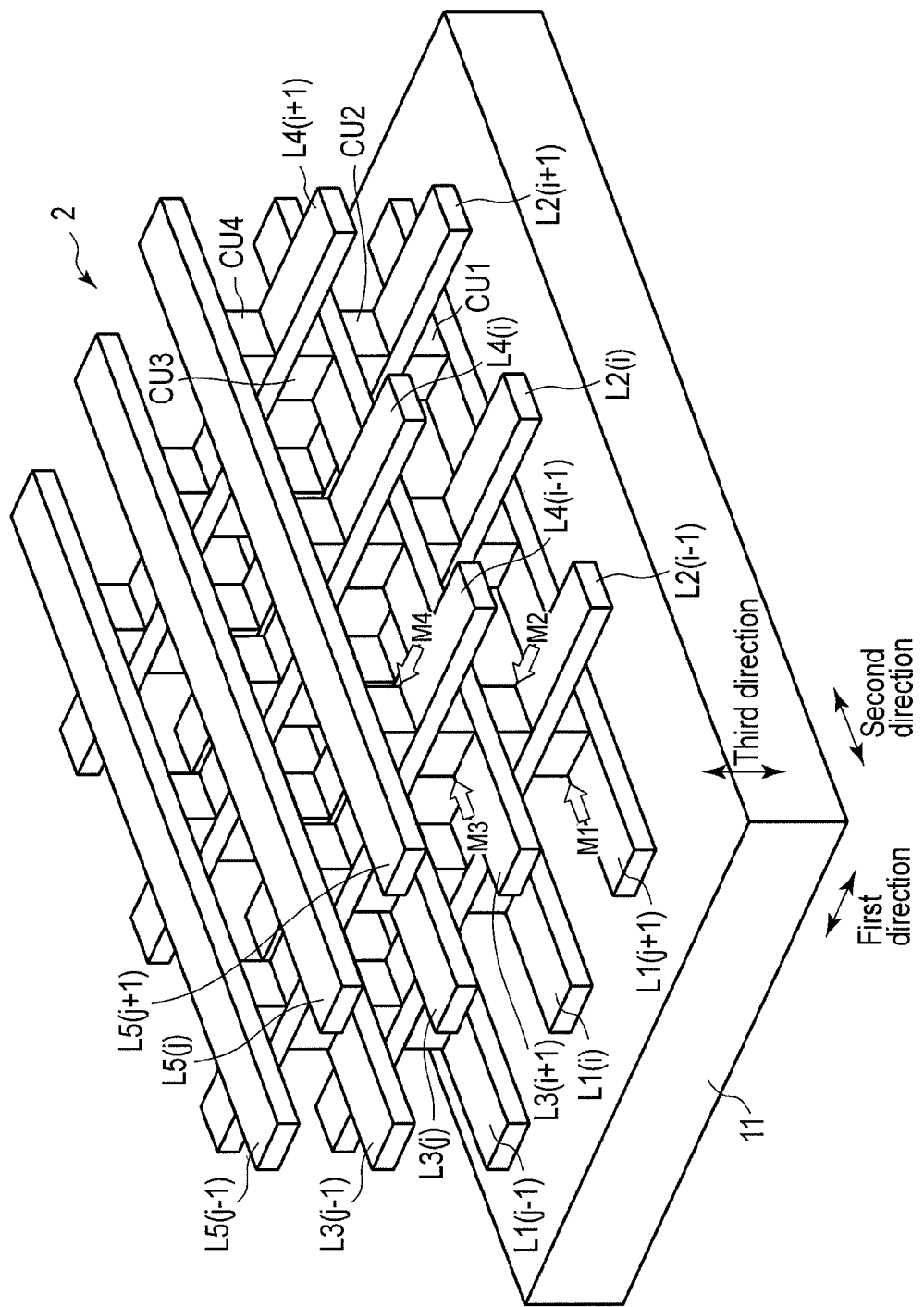
F I G. 15

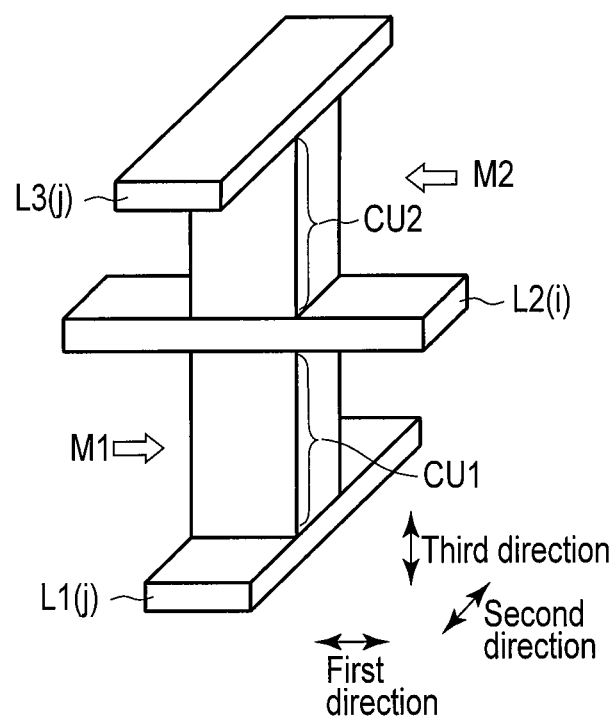
F I G. 16

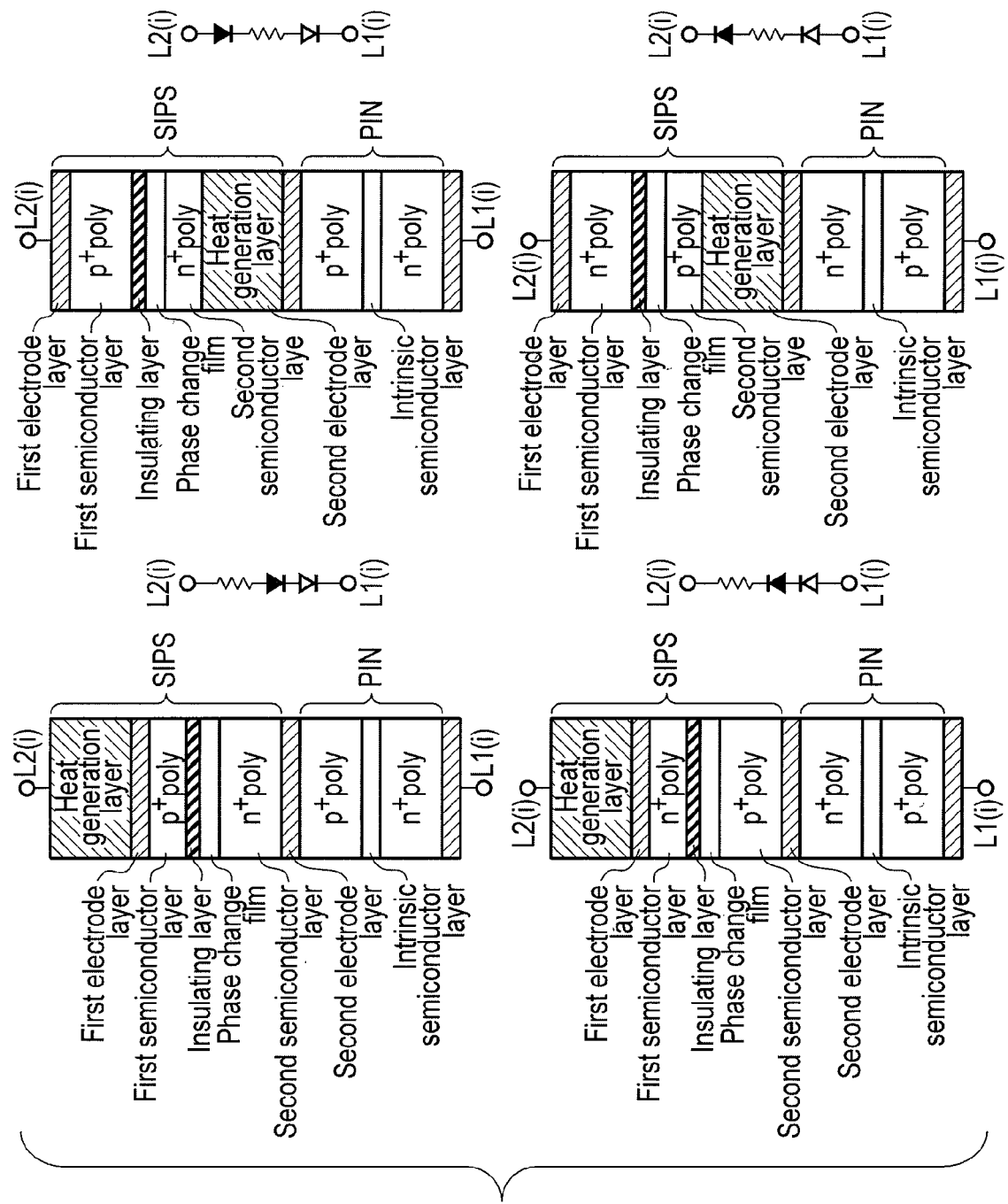
F I G. 18

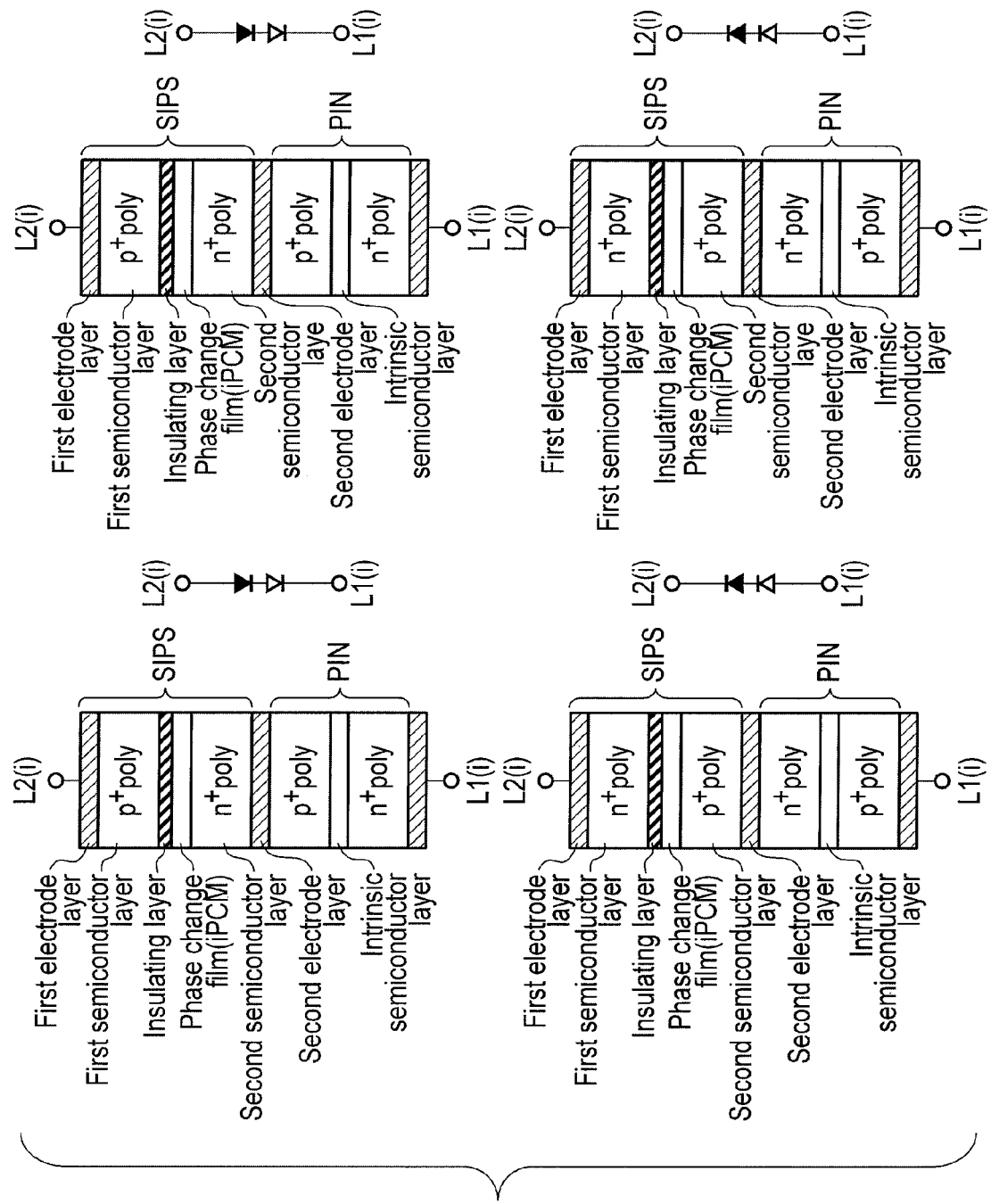
F I G. 22

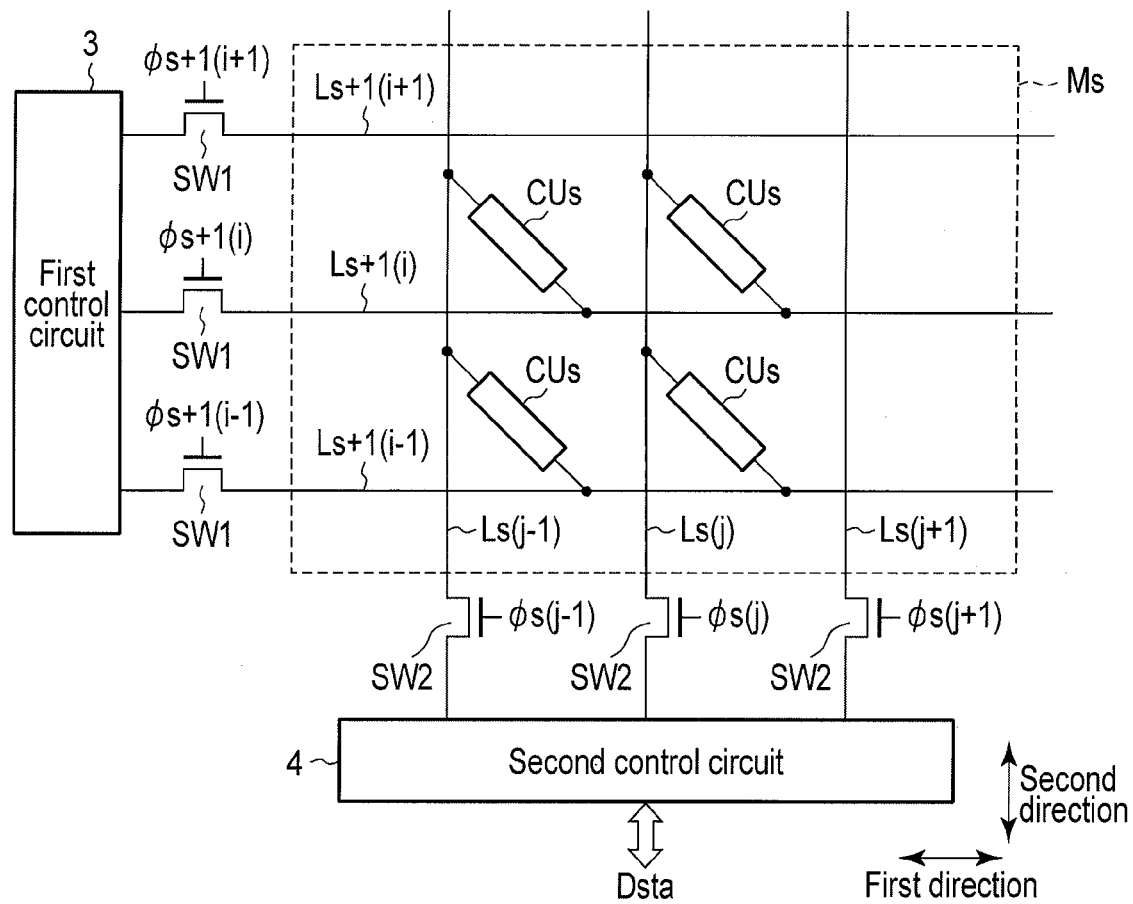
F I G. 23

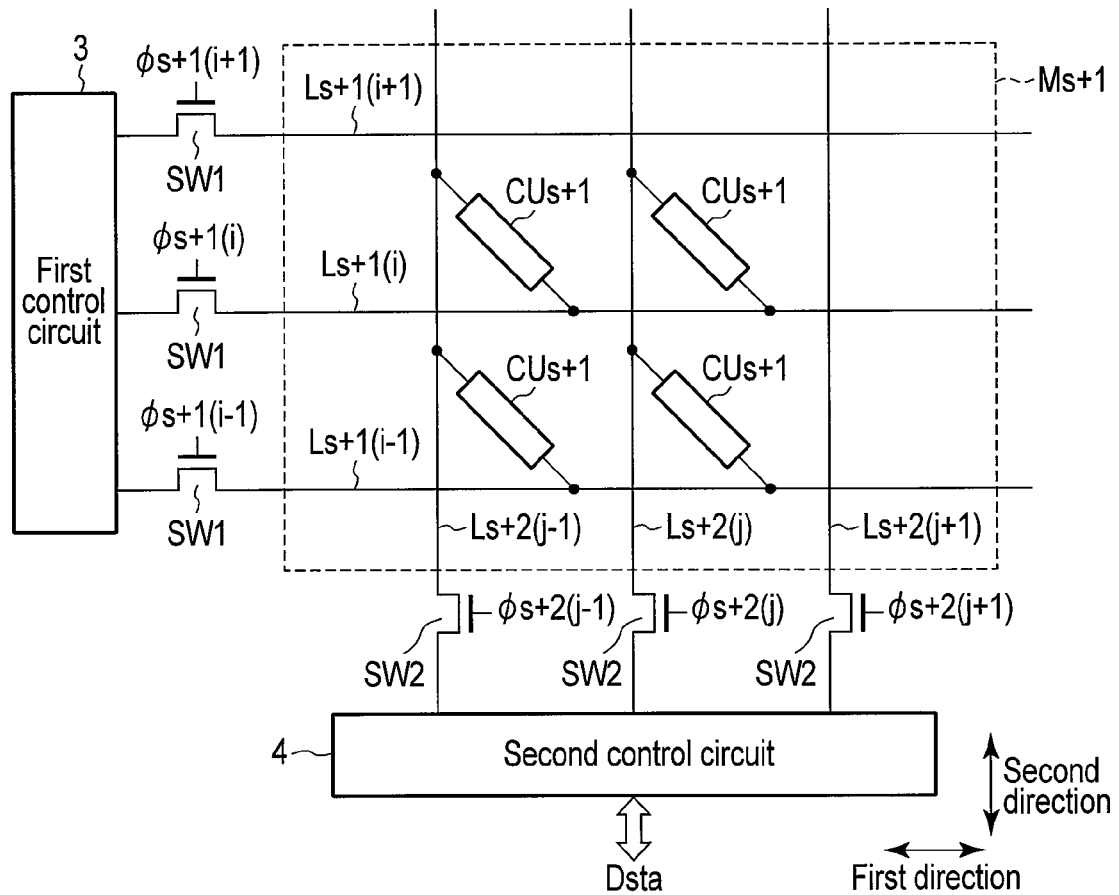
F I G. 24

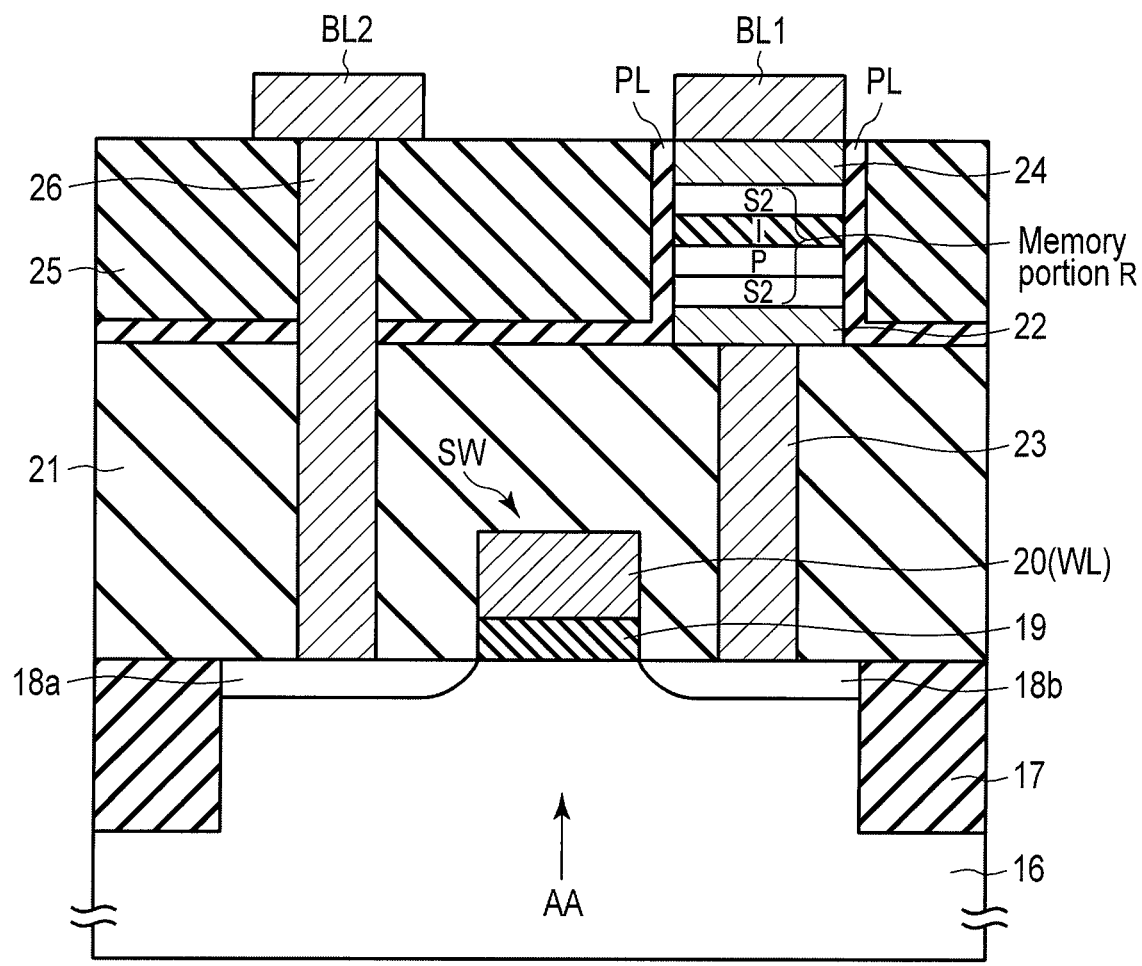
F I G. 26

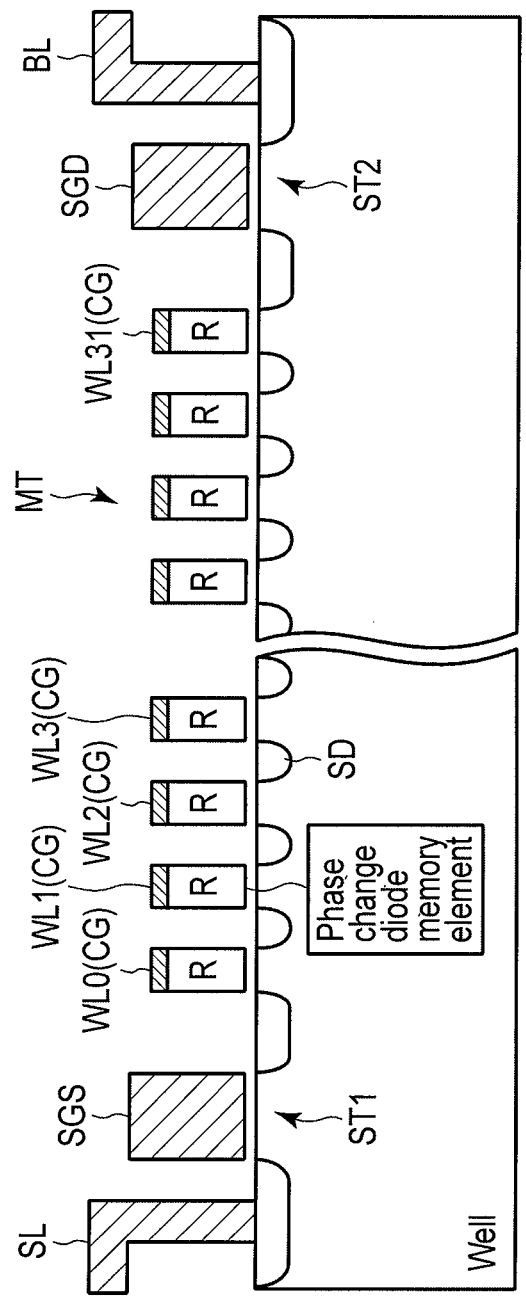
F I G. 29

NONVOLATILE SEMICONDUCTOR MEMORY DEVICE

CROSS-REFERENCE TO RELATED APPLICATIONS

This application is based upon and claims the benefit of priority from Japanese Patent Application No. 2013-036948, filed Feb. 27, 2013, the entire contents of which are incorporated herein by reference.

FIELD

Embodiments described herein relate generally to a nonvolatile semiconductor memory device.

BACKGROUND

It is necessary for a nonvolatile semiconductor memory device to reduce the power consumption, microfabricate the elements, reduce the cost, increase the recording density and the ON/OFF ratio, and improve the rewrite durability and the data retention characteristic as the capacity of the nonvolatile memory increases.

In particular, a phase change memory (PC-RAM: Phase Change Random Access Memory) is a nonvolatile semiconductor memory device that writes/erases/reads information using the fact that the electrical resistance of a phase change film changes between a crystalline state and an amorphous state.

To obtain a desired electrical resistance change in this phase change memory, the phase change film needs to be heated almost to the melting point or to the crystallization temperature or more. In addition, a relatively large volume and power are required. For these reasons, it is difficult to solve the above-described problems including the microfabrication and the reduction of power consumption. Hence, a technique of solving these problems is demanded.

BRIEF DESCRIPTION OF THE DRAWINGS

FIG. 1 is a sectional view of a phase change memory cell;

FIG. 2 is a sectional view of an SIS diode;

FIG. 5 is a view showing the phase change of a phase change diode memory element according to the embodiment;

FIG. 12 is a table showing the conditions of constituent elements and the ON/OFF ratio of the SPIS element according to the second embodiment;

FIG. 13 is a table showing the conditions of constituent elements and the ON/OFF ratio of the SPIS element according to the third embodiment;

FIG. 15 is a perspective view showing a cross-point type memory cell array as an application example of the each embodiment;

FIG. 16 is a perspective view showing cell units as an application example of the each embodiment;

FIG. 18 is a view showing connection relationships between an SIPS element and a rectifying element as an application example of the each embodiment;

FIG. 22 is a view of a cell unit including an SIP (iPCM film) S element without a heat generation layer as an application example of the each embodiment;

FIG. 23 is a block diagram showing the layout of a first control circuit and a second control circuit as an application example of the each embodiment;

FIG. 24 is a block diagram showing the layout of a first control circuit and a second control circuit as an application example of the each embodiment;

FIG. 26 is a sectional view showing an example of 1T1R type cell unit MC as an application example of the each embodiment;

FIG. 29 is a sectional view of a memory cell string of the NAND type resistance change memory as an application example of the each embodiment.

DETAILED DESCRIPTION

In general, according to one embodiment, a nonvolatile semiconductor memory device comprises a memory cell which stores data with two or more levels. The memory cell includes a structure comprising a first electrode layer, a first semiconductor layer, a phase change film, an electrical insulating layer, a second semiconductor layer, and a second electrode layer arranged in order thereof, and the first semiconductor layer and the second semiconductor layer have carrier polarities different from each other.

The embodiments of the present invention will now be described with reference to the accompanying drawings.

Basic Concept

A phase change memory cell according to the embodiment generally has a structure in which a phase change film is sandwiched between two electrodes, as shown in FIG. 1. When applying a current to the phase change film through the two electrodes, the phase change film is heated to the melting point or crystallization temperature or more by changing the current application method. After that, when cooling the phase change film, the phase change film is cooled rapidly or slowly by appropriately controlling the cooling temperature. By this temperature control, the phase change film reversibly changes to an amorphous state or a crystalline state. The electrical resistivity of the phase change film is higher in the amorphous state than in the crystalline state. Hence, information "1" or "0" can be read using the difference in the electrical resistivity generated by the phase change. In addition, the phase change memory cell can record multi-level data by changing the pulse application state.

To phase-change the phase change film from the crystalline state to the amorphous state, the phase change film needs to be heated almost to the melting point or more. In addition, to obtain a desired resistance change, a relatively large volume and current are necessary. Hence, in the structure in which the phase change film is sandwiched between two electrodes, as shown in FIG. 1, it is difficult to solve the problems such as the microfabrication and the reduction of power consumption of the phase change memory.

FIG. 2 illustrates the element structure of an SIS (semiconductor layer/electrical insulating layer/semiconductor layer) diode. The SIS diode has a stacked structure including first semiconductor layer (S1)/electrical insulating layer (I)/second semiconductor layer (S2). The first semiconductor layer and the second semiconductor layer are a pair of semiconductor layers whose polarities are different from each other. For example, a structure in which an n-type semiconductor, an electrical insulator, and a p-type semiconductor are stacked in this order or a structure in which a p-type semiconductor, an electrical insulator, and an n-type semiconductor are stacked in this order is available.

Figure 3:
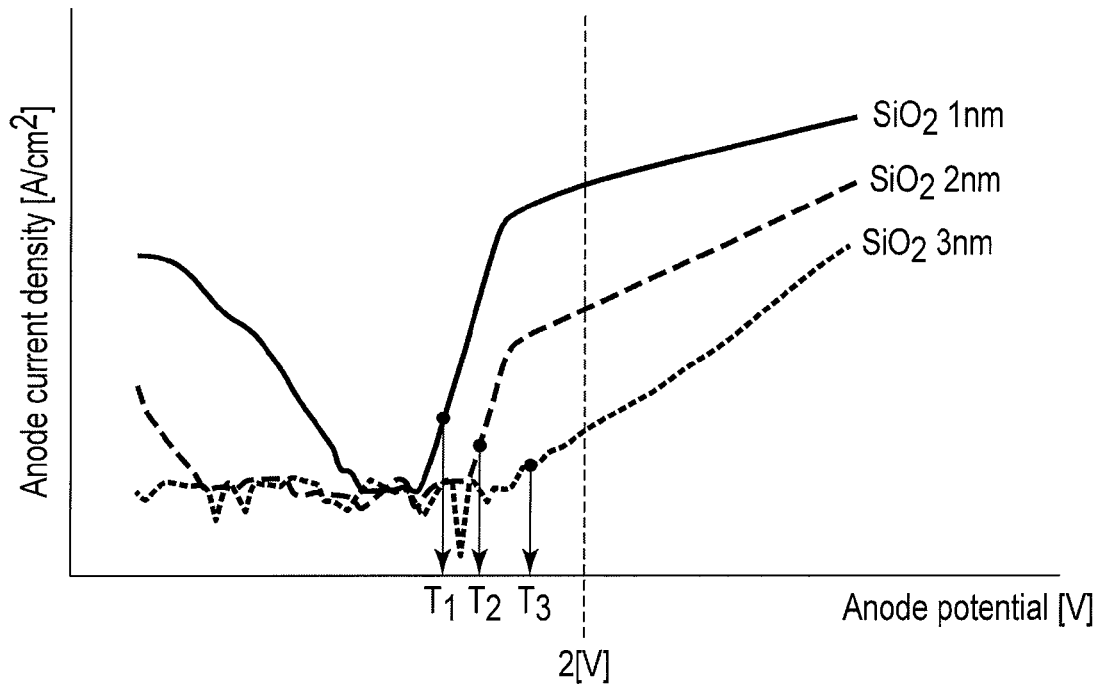
FIG. 3 is a graph showing the V-I characteristic of the SIS diode.

FIG. 3 shows a change in the anode current density [A/cm$^2$] to the anode potential [V] of an SIS diode when the electrical insulating layer has a film thickness of 1 nm, 2 nm, or 3 nm. The cathode potential of the SIS diode is 0 [V].

As shown in FIG. 3, for example, when the anode potential is 2 [V], the value of the anode current density is maximized when the film thickness of the electrical insulating layer is 1 nm, and minimized when the film thickness of the electrical insulating layer is 3 nm. The threshold is minimized ($T_1$) when the film thickness of the electrical insulating layer is 1 nm, and maximized ($T_3$) when the film thickness of the electrical insulating layer is 3 nm. The threshold indicates the anode potential at the point where the anode current abruptly changes when the anode potential is positive.

Figure 4:
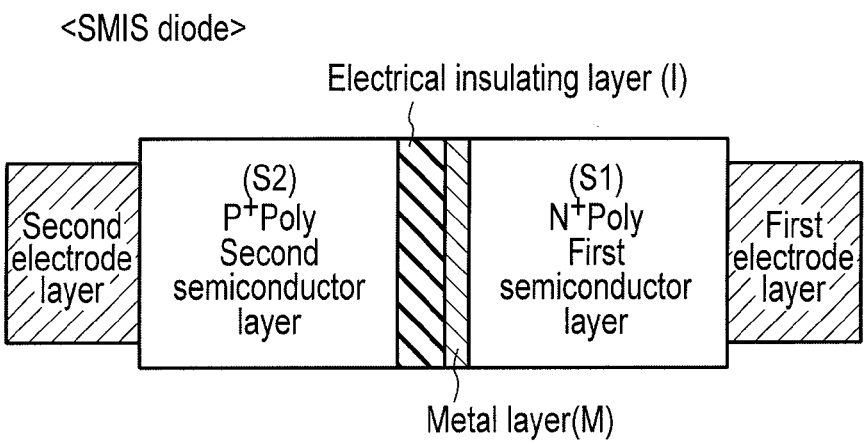
FIG. 4 is a sectional view of an SMIS diode according to the embodiment.

FIG. 4 illustrates the element structure of an SMIS (semiconductor layer/metal layer/electrical insulating layer/semiconductor layer) diode. The SMIS diode has a stacked structure including first semiconductor layer/metal layer/electrical insulating layer/second semiconductor layer. For example, a structure in which an n-type semiconductor, a metal, an electrical insulator, and a p-type semiconductor are stacked sequentially, a structure in which a p-type semiconductor, a metal, an electrical insulator, and an n-type semiconductor are stacked sequentially, or the like is available. The SMIS diode exhibits the same characteristic as that of the SIS diode for a change in the anode current density to the anode potential.

That is, for the SIS diode and the SMIS diode, since the threshold changes in accordance with the film thickness of the electrical insulating layer sandwiched by the pair of semiconductor layers having different polarities, an anode current density value corresponding to the thickness can be obtained for the same anode potential value.

This embodiment proposes a technique of reversibly obtaining the characteristic of the SIS diode and the characteristic of the SMIS diode by replacing the metal layer of the SMIS diode with a phase change film, as shown in FIG. 4.

FIG. 5 shows a change in the element structure of a phase change diode memory element caused by a phase change.

As shown in FIG. 5, the phase change film in the amorphous state can almost be regarded as an electrical insulating layer. Hence, the structure changes to the structure of the SIS diode including the first semiconductor layer, the electrical insulating layer, and the second semiconductor layer. On the other hand, the phase change film in the crystalline state can almost be regarded as a metal layer. Hence, the structure changes to the structure of the SMIS diode including the first semiconductor layer, the metal layer, the electrical insulating layer, and the second semiconductor layer.

As a characteristic feature of this embodiment, the threshold is changed by effectively changing the thickness of the electrical insulating layer using the phase change of the phase change film sandwiched by the pair of semiconductor layers having different polarities.

More specifically, as shown in FIGS. 6, 7, 8, and 9, an SPIS (semiconductor layer/phase change film/electrical insulating layer/semiconductor layer) structure (FIG. 6) including first semiconductor layer (S1)/phase change film (P)/electrical insulating layer (I)/second semiconductor layer (S2), an SIPS (semiconductor layer/electrical insulating layer/phase change film/semiconductor layer) structure (FIG. 7) including first semiconductor layer (S1)/electrical insulating layer (I)/phase change film (P)/second semiconductor layer (S2), an SMPIS (semiconductor layer/metal layer/phase change film/electrical insulating layer/semiconductor layer) structure (FIG. 8) including first semiconductor layer (S1)/metal layer (M)/phase change film (P)/electrical insulating layer (I)/second semiconductor layer (S2), and an SIPMS (semiconductor layer/electrical insulating layer/phase change film/metal layer/semiconductor layer) structure (FIG. 9) including first semiconductor layer (S1)/electrical insulating layer (I)/phase change film (P)/metal layer (M)/second semiconductor layer (S2) are available.

The first semiconductor layer and the second semiconductor layer are connected to a first electrode layer and a second electrode layer, respectively. One of the two electrode layers also serves as a heat generation layer to change the temperature of the phase change film. The first semiconductor and the second semiconductor are a p-type semiconductor and an n-type semiconductor and vice versa and constitute a diode as a pair of semiconductor layers having different polarities.

The above-described diode type memory element including a phase change film will be referred to as a phase change diode memory element, or an SPIS element, an SIPS element, an SMPIS element, and an SIPMS element.

This phase change diode memory element can indirectly detect a change in the electrical resistance caused by the phase change of the phase change film based on a change in the current amount with respect to an applied voltage, like a general phase change memory. The phase change diode memory element can also detect the change in the electrical resistance caused by the phase change of the phase change film based on a change in the threshold of the diode, unlike the general phase change memory. The phase change diode memory element is hardly affected by various kinds of noise or disturbance and can therefore easily implement multi-level recording.

The general phase change memory phase-changes a portion necessary for a desired resistance change, thereby writing/erasing/reading data. In the phase change diode memory element of this embodiment, however, the phase change region necessary for a desired resistance change is narrower than in the general phase change memory. It is therefore possible to reduce the current amount necessary for ON/OFF of the phase change memory. Additionally, element segregation and the like in the phase change film can be suppressed at the time of rewrite.

Most preferably, the electrical insulating layer of the above-described phase change diode memory element mainly contains one of $SiO_2$, $Al_2O_3$, and SiN. The film thickness of the electrical insulating layer is preferably 0.5 to 3 [nm] as the equivalent $SiO_2$ thickness (equivalent oxide thickness: EOT).

The phase change film is preferably made of GeTe, SnTe, AlTe, GeSbTe, GeBiTe, GeSbSnTe, GeSbBiTe, GeInTe, GeSbinTe, GeBiInTe, GeSnTe, CuSbTe, GeSb, GaSb, a stacked film of GeTe and $Sb_2Te_3$, or a stacked film of AlTe and $Sb_2Te_3$. However, the composition ratio is not limited to this. The film thickness of the phase change film preferably ranges from 1 to 40 [nm].

The major component of the first semiconductor layer and the second semiconductor layer is Si. The film thickness is preferably 10 to 30 [nm]. The impurity concentration of the first semiconductor layer and the second semiconductor layer is preferably $1 \times 10^{20}$ to $1 \times 10^{21}$ [$cm^{-3}$].

The phase change diode memory element will be described below in detail in accordance with an embodiment.

First Embodiment

The first embodiment of the phase change diode memory element is an SPIS element.

Figure 6:
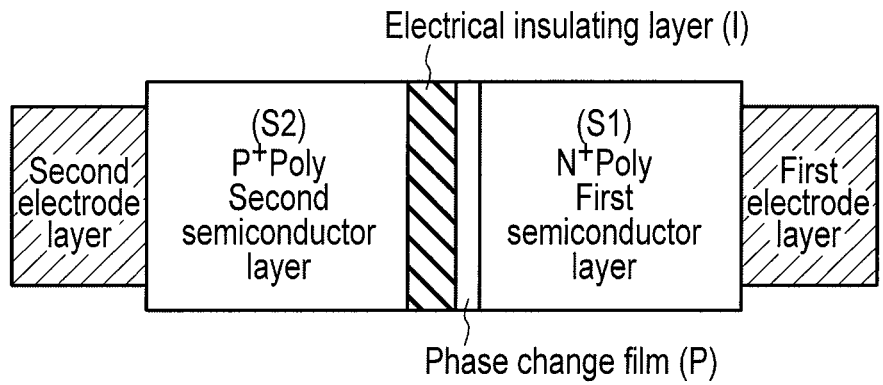
FIGS. 6 and 7 are sectional views of an SPIS element according to the first embodiment.

FIG. 6 is a sectional view of an SPIS element.

The first embodiment is directed to an SPIS element including a first electrode layer, a first semiconductor layer formed on the first electrode layer, a phase change film formed on the first semiconductor layer, an electrical insulating layer formed on the phase change film, a second semiconductor layer formed on the electrical insulating layer and having a carrier polarity different from that of the first semiconductor layer, and a second electrode layer formed on the second semiconductor layer.

Note that since the underlying structure of the phase change diode memory element and the layout of the phase change diode memory element array including select transistors, word lines, and bit lines connected to the phase change diode memory element can variously be modified in the embodiment, only the phase change diode memory element for storing information will be described in this embodiment.

The layout of the memory cell array of a resistance change memory including select transistors and word lines will be described in application examples.

The first electrode layer is made of, for example, tungsten W and also serves as a heater (heat generation layer) that changes the temperature of the phase change film. The first semiconductor is an n-type semiconductor containing P (phosphorus) or As (arsenic) as a dopant. The activation concentration is $1 \times 10^{20}$ [$cm^{-3}$], and the film thickness is 30 [nm]. The phase change film is made of GeTe and has a film thickness of 2 [nm]. The electrical insulator is made of $SiO_2$ and has a film thickness of 1.5 [nm]. The second semiconductor is a p-type semiconductor containing B (boron) as a dopant. The activation concentration is $1 \times 10^{20}$ [$cm^{-3}$], and the film thickness is 30 [nm]. A TiN film or a stacked film of Ti/TiN may be inserted between the first electrode layer and the first semiconductor layer in order to reduce the contact resistance.

Note that for the purpose of easily transmitting heat from the electrode layer serving as the heat generation layer to the phase change film, the semiconductor layer in contact with the electrode layer serving as the heat generation layer is preferably thin. For example, when the first electrode layer serves as the heat generation layer, the first semiconductor layer is preferably thinner than the second semiconductor layer. When the second electrode layer serves as the heat generation layer, and the first semiconductor layer is thinner than the second semiconductor layer, a structure including first electrode layer/second semiconductor layer/electrical insulating layer/phase change film/first semiconductor layer/second electrode layer is possible.

Figure 10:
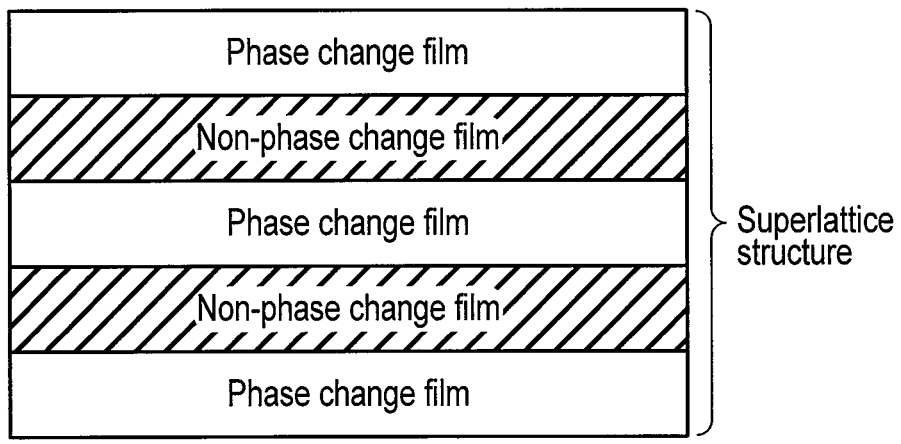
FIG. 10 is a sectional view showing the superlattice structure of an iPCM film according to the first embodiment.

The phase change film can also be made of SnTe, AlTe, GeSbTe, GeBiTe, GeSbSnTe, GeSbBiTe, GeInTe, GeSbinTe, GeBiInTe, GeSnTe, CuSbTe, GeSb, GaSb, a stacked film of GeTe and $Sb_2Te_3$, or a stacked film of AlTe and $Sb_2Te_3$ other than GeTe. However, the composition ratio is not limited to this. The stacked film of GeTe and $Sb_2Te_3$ or the stacked film of AlTe and $Sb_2Te_3$ may have a superlattice structure called iPCM (interface-Pace Change Memorial) in which a phase change film and a non-phase change film are alternately stacked, as shown in FIG. 10.

The electrical insulating layer can also be made of $Al_2O_3$, SiN, or the like other than $SiO_2$. A stacked structure of these materials may be used. Alternatively, a compound such as $SiO_n$, a mixture, or the like may be used.

As for the first semiconductor layer and the second semiconductor layer, a poly-Si film is deposited and annealed after or during element formation, thereby increasing the crystallinity. The annealing method and the like will be described later concerning the manufacturing method.

Write (record) of SPIS will be described below.

The SPIS element undergoes various kinds of annealing processes after formation. Hence, the phase change film is in a low-resistance crystalline state. In the crystalline state, the phase change film acts as a so-called narrow-band semiconductor, semimetal, or metal. For this reason, the phase change film in the crystalline state basically exhibits a metal characteristic, that is, a low-resistance state. Hence, the SPIS element in the initial state has a structure in which the electrical insulating layer and a metal layer are inserted between the first semiconductor layer and the second semiconductor layer.

When a relatively large current/voltage in the forward direction is applied to the SPIS element in the initial state as short pulses, the phase change film changes to an amorphous state.

The phase change film in the amorphous state has a higher resistance as compared to that in the crystalline state and exhibits a characteristic close to the electrical insulating layer. Hence, the SPIS element whose phase change film has changed to the amorphous state has a structure in which two high-resistance films including the electrical insulating layer and a layer whose resistance is high but not so as the electrical insulating layer are inserted between the first semiconductor layer and the second semiconductor layer.

When the phase change film of the SPIS element is in the amorphous state, the SPIS element exhibits a high-resistance state, and information is written(recorded).

Erase of the SPIS element will be described next.

When a relatively small current/voltage in the forward direction is applied to the SPIS element after the write(record) as relatively long pulses, the phase change film causes a phase change again from the high-resistance amorphous state to the low-resistance crystalline state. Hence, the information written in the SPIS element is erased.

In the above-described way, the current/voltage application method to the SPIS element is adjusted, thereby reversibly phase-changing the phase change film of the SPIS element to the high-resistance amorphous state or the low-resistance crystalline state. That is, information write and erase in the SPIS element are repetitively performed by reversibly changing the phase change film of the SPIS element.

When the first electrode layer connected to the n-type first semiconductor layer serves as the negative electrode, and the second electrode layer connected to the p-type second semiconductor layer serves as the positive electrode, the direction of the current/voltage applied to the SPIS element is forward. Conversely, when the first electrode layer connected to the n-type first semiconductor layer serves as the positive electrode, and the second electrode layer connected to the p-type second semiconductor layer serves as the negative electrode, the direction of the current/voltage applied to the SPIS element is reverse.

Read of the SPIS element will be described next.

Figure 11:
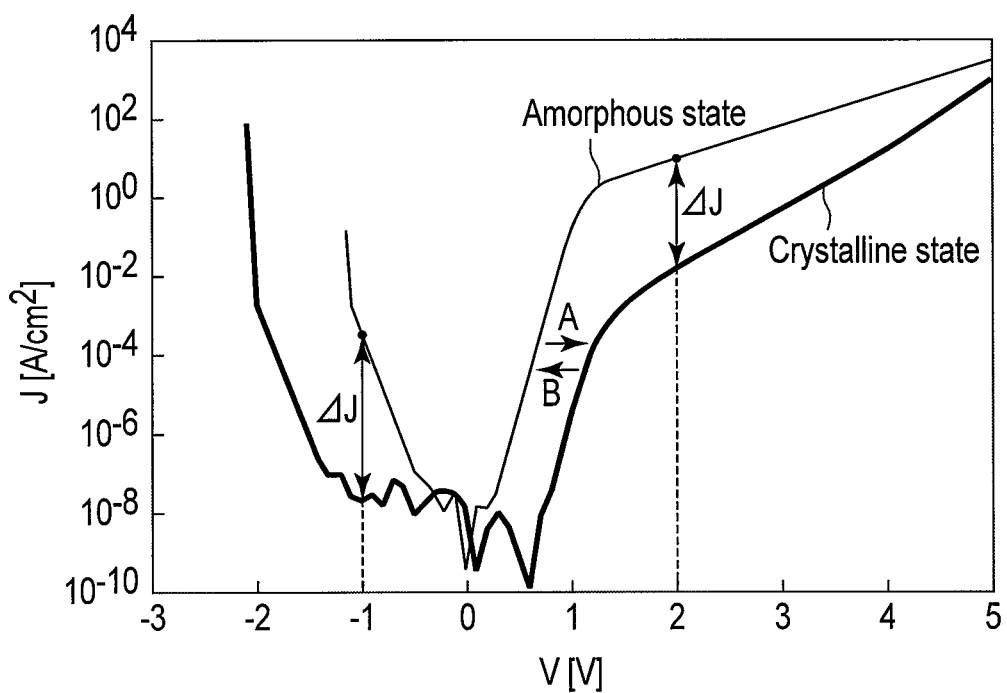
FIG. 11 is a graph showing the V-I characteristic of the SPIS element according to the first embodiment.

FIG. 11 shows a change in a current density J [A/cm$^2$] to a voltage V [V] between the anode and cathode of the SPIS element when its phase change film is in the crystalline state or the amorphous state. For the sake of simplicity, the cathode potential is fixed to 0 [V], and the anode potential is changed. In this example, the thickness of the electrical insulating layer $SiO_2$ of the SPIS element is 2.5 [nm], and the phase change film is made of GeTe and has a thickness of 4 [nm].

As shown in FIG. 11, when the phase change film of the SPIS element is in the crystalline state of the initial state, the threshold of the SPIS element shifts to the positive side from that of the SPIS element whose phase change film is in the amorphous state (arrow A). On the other hand, when the phase change film is in the amorphous state, the threshold of the SPIS element shifts to the negative side from that of the SPIS element whose phase change film is in the crystalline state (arrow B). In this case, the current density corresponding to the same voltage (for example, −1 V, 2 V, or the like) is higher when the phase change film is in the amorphous state than in the crystalline state. For this reason, the ON current of the SPIS element is larger when the phase change film is in the amorphous state than in the crystalline state.

As described above, the threshold shifts or the current changes in accordance with the phase state of the phase change film of the SPIS element. Hence, the crystalline state (erase) or the amorphous state (write(record)) can be read by measuring the magnitude of the current value with respect to a predetermined voltage. The current value difference ΔJ generated by the phase change of the SPIS element can have two or more orders of magnitude. The ON/OFF ratio that is the ratio of write and erase is higher than that of a general phase change memory element.

Even when the direction of the current/voltage applied to the SPIS element is reverse, the voltage when the current rises changes depending on the state of the phase change film. Hence, read is possible not only when the direction of the current/voltage applied to the SPIS element is forward but also when the direction is reverse.

Using this characteristic, when data write or erase is done by applying a desired current or voltage to the SPIS element, verify can be performed by applying a reverse current or voltage to the SPIS element. Verify is read for verification that is performed to confirm whether the write or erase is normally done in the SPIS element. That is, in the SPIS element of this embodiment, not only verify by applying a forward current or voltage but also verify by applying a reverse current or voltage can be performed.

The SPIS element according to the first embodiment can read at a low voltage, unlike a general NAND flash memory. For this reason, the load on the circuit is light, and the peripheral circuits can be made small. It is also possible to quickly perform write(record) and erase.

Write/erase/read for the SPIS element according to this embodiment can be done by changing not only the current/voltage to be applied to the SPIS element but also the application time and pulses. Hence, there is little fear of read disturbance.

In addition, the SPIS element of the first embodiment can make the phase change film very thin and can therefore reduce the sectional area and volume necessary for a phase change, unlike the general phase change memory. For this reason, the energy necessary for a phase change can be reduced as compared to the general phase change memory. Hence, when repeating write/erase (when performing rewrite), mainly, small segregation in the phase change film can be neglected. For this reason, the rewrite durability of the SPIS element according to the first embodiment is sufficiently high. Note that the element is preferably made smaller for these situations.

The above-described operation enables to reversibly perform write(record) and erase of information and also read the information.

As described above, according to the first embodiment, the ON/OFF ratio can be made higher than in a general phase change memory. In addition, read can be performed using such a low voltage that generates no heat in the heat generation layer. For these reasons, the power consumption in read is very low, and read disturbance caused by an unintended phase change rarely occurs.

When an iPCM film is used as the phase change film, the volume necessary for the phase change is smaller than in a normal phase change film because the iPCM film is a phase change film having a superlattice structure in which a phase change film and a non-phase change film are alternately stacked. This allows to perform write/erase using a small current in addition to the above-described effects.

A general phase change memory causes a phase change radially (in a dome shape) centered on the vicinity of the heat generation layer. That is, a region that phase-changes and a region that does not phase-change exist in the phase change film. If such a partial and nonuniform phase change occurs, a phase change film having a volume more than necessity is used as a base. Hence, microfabrication is difficult. On the other hand, in the first embodiment, since the electrical insulating layer and the phase change film are stacked, the volume necessary for a phase change is small. Since the phase change uniformly occurs, a phase change film having a minimum necessary volume is used as a base. Hence, microfabrication is easy. In addition, the power consumption is reduced, and the ON/OFF ratio is also improved.

Furthermore, since the read can be performed even in the reverse direction, the verify can be simplified.

Second Embodiment

The second embodiment is a modification of the first embodiment.

The conditions of the semiconductor layers and the electrical insulating layer included in the SPIS element are different from those of the first embodiment. The remaining points are the same as in the first embodiment, and a detailed description thereof will be omitted.

More specifically, the activation concentration of each of the first semiconductor layer and the second semiconductor layer is $1\times10^{20}$ to $1\times10^{21}$ [cm$^{-3}$]. The film thickness of each of the first semiconductor layer and the second semiconductor layer is 10 to 30 [nm]. The film thickness of the electrical insulating layer SiO$_2$ changes within the range of 0.5 to 3 [nm].

FIG. 12 is a table showing the conditions of constituent elements and the ON/OFF ratio of the SPIS element. The ON/OFF ratio is defined as Ion/Ioff.

As shown in the table of FIG. 12, the ON/OFF ratio of the SPIS element under each condition is $1\times10^3$ or more, revealing that the SPIS element exhibits an excellent characteristic under any condition.

As described above, according to the second embodiment, a sufficient ON/OFF ratio can be obtained.

Third Embodiment

Third embodiment is a modification of the first embodiment.

The conditions of the semiconductor layers, the electrical insulating layer, and the phase change film included in the SPIS element are different from those of the first embodiment. The remaining points are the same as in the first embodiment, and a detailed description thereof will be omitted.

More specifically, the activation concentration of each of the first semiconductor layer and the second semiconductor layer is $1\times10^{20}$ [cm$^{-3}$]. The film thickness of each of the first semiconductor layer and the second semiconductor layer is 30 [nm]. When the film thickness of the electrical insulating layer SiO$_2$ is 1.5 [nm], the film thickness of the phase change film changes within the range of 1 to 40 [nm].

FIG. 13 is a table showing the conditions of constituent elements and the ON/OFF ratio of the SPIS element. The ON/OFF ratio is defined as Ion/Ioff.

As shown in the table of FIG. 13, the ON/OFF ratio of the SPIS element under each condition is $1\times10^3$ or more, revealing that the SPIS element exhibits an excellent characteristic under any condition.

As described above, according to the third embodiment, a sufficient ON/OFF ratio can be obtained.

Fourth Embodiment

Fourth embodiment is a modification of the first embodiment.

The conditions of the elements included in the SPIS element are different from those of the first embodiment. The remaining points are the same as in the first embodiment, and a detailed description thereof will be omitted.

More specifically, as the electrical insulating layer, Al$_2$O$_3$, SiN, or SiO$_2$ is used. A stacked film of SiO$_2$ and Al$_2$O$_3$ is also used as the electrical insulating layer.

In the fourth embodiment as well, a sufficient ON/OFF ratio can be obtained, as in the first to third embodiments.

Figure 7:
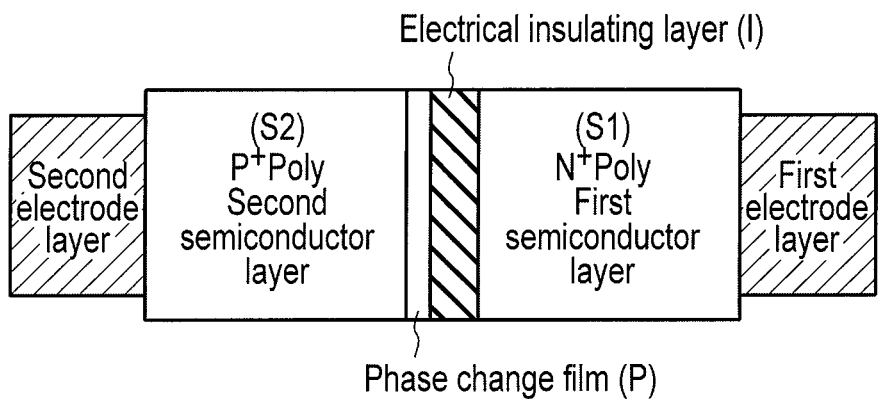

In the above-described first to fourth embodiments, the stacking order of the phase change film and the electrical insulating layer sandwiched between the first semiconductor layer and the second semiconductor layer may be reversed. That is, a SIPS structure including first electrode layer/first semiconductor layer/electrical insulating layer/phase change film/second semiconductor layer/second electrode layer as shown in FIG. 7 may be used.

In this case, to efficiently transmit heat from the heat generation layer to the phase change film, the semiconductor layer sandwiched between the phase change film and the electrode layer serving as the heat generation layer is preferably thinner than the semiconductor layer sandwiched between the insulating layer and the electrode layer that does not serve as the heat generation layer.

Fifth Embodiment

Fifth embodiment is a modification of the first embodiment.

The fifth embodiment of the phase change diode memory element is an SMPIS element.

Figure 8:
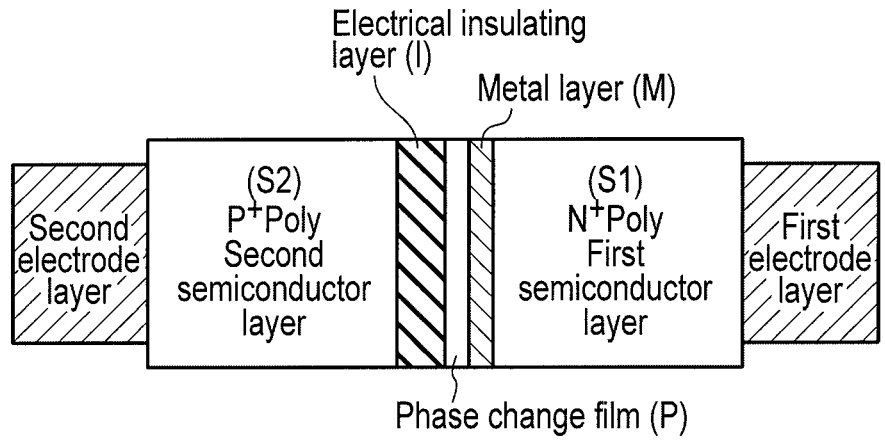
FIG. 8 is a sectional view of an SMPIS element according to the first embodiment.

FIG. 8 is a sectional view of an SMPIS element.

As the characteristic feature of fifth embodiment, a metal layer is connected to the phase change film of the first embodiment. The remaining points are the same as in the first embodiment, and a detailed description thereof will be omitted.

More specifically, fifth embodiment is directed to an SMPIS element including a first electrode layer, a first semiconductor layer formed on the first electrode layer, a metal layer formed on the first semiconductor layer, a phase change film formed on the metal layer, an electrical insulating layer formed on the phase change film, a second semiconductor layer formed on the electrical insulating layer and having a carrier polarity different from that of the first semiconductor layer, and a second electrode layer formed on the second semiconductor layer.

Connecting the metal layer to the phase change film enables to make the phase change film thinner. For this reason, the volume necessary for a phase change decreases, and the energy necessary for a phase change can be reduced.

Figure 9:
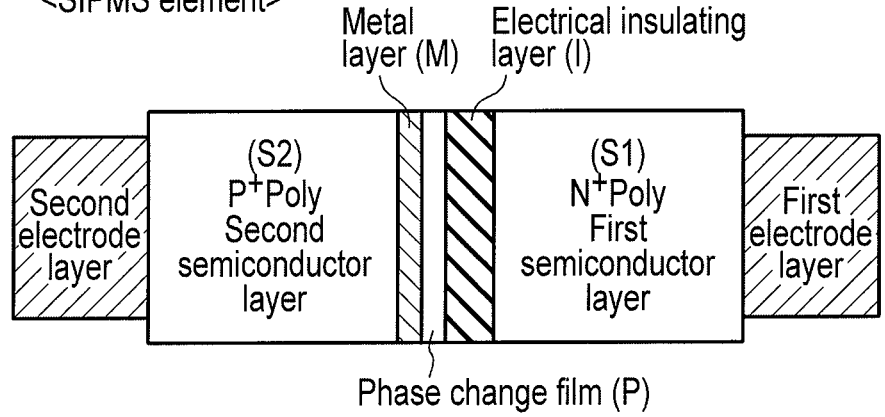
FIG. 9 is a sectional view of an SIPMS element according to the first embodiment.

In the above-described fifth embodiment, the stacking order of the metal layer, the phase change film, and the electrical insulating layer sandwiched between the first semiconductor layer and the second semiconductor layer may be reversed. That is, a SIPMS structure including first electrode layer/first semiconductor layer/electrical insulating layer/phase change film/metal layer/second semiconductor layer/second electrode layer as shown in FIG. 9 may be used.

In this case, to efficiently transmit heat from the heat generation layer to the phase change film, the semiconductor layer sandwiched between the phase change film and the electrode layer serving as the heat generation layer is preferably thinner than the semiconductor layer sandwiched between the insulating layer and the electrode layer that does not serve as the heat generation layer.

In the first to fifth embodiments, when an iPCM film is used as the phase change film, the heat generation layer can be omitted.

As described above, according to the first to fifth embodiments, the phase change is reversibly changed, thereby reversibly recording and erasing information in the phase change diode memory element and also reading the information. A nonvolatile semiconductor memory device using the phase change diode memory element implements a high ON/OFF ratio, a high-speed operation (record and erase), excellent rewrite durability and data retention characteristic, a low-current operation, and low power consumption, and is more suitable for microfabrication than before.

APPLICATION EXAMPLES

Application of the phase change diode memory element according to the above-described embodiment to a resistance change memory as a resistance change element will be described.

First, as the first application example, a cross-point type memory cell array will be described. As the second application example, a 1T1R type memory cell array in which one resistance change element (phase change diode memory element) is connected to one select transistor will be described. Finally, as the third application example, application to a NAND string structure will be described.

Note that in the second application example, $6F^2$ design will be explained. However, when a vertical transistor is used, or when the first application example is used, $4F^2$ cell design is also possible. F is a reference value used to determine the LSI layout at the time of design and is not particularly predetermined. F indicates, for example, a minimum size (feature size or half pitch of line & space) workable by photolithography.

First Application Example

The first application example is a resistance change memory using a phase change diode memory element as a resistance change element and has a cross-point type memory cell array.

The cross-point type memory cell array includes a 1D1R type memory cell in which one resistance change element (phase change diode memory element) and one rectifying element (diode or selector) are connected in series. When the memory cell is connected between a word line and a bit line, a current flows only to the selected memory element. In addition, a large memory capacity can be implemented by 3D integration.

Figure 14:
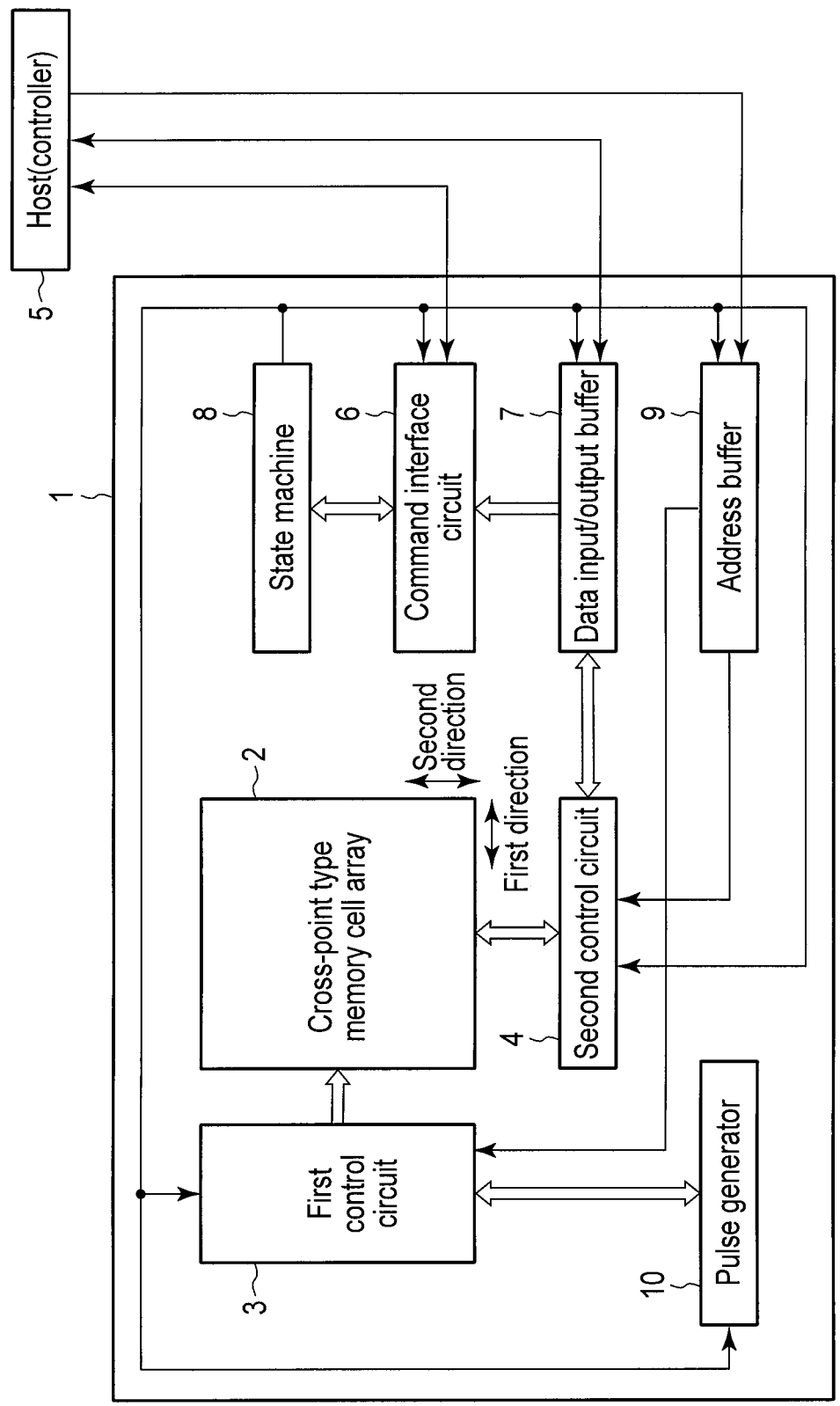
FIG. 14 is a block diagram showing a cross-point type resistance change memory as an application example of the each embodiment.

FIG. 14 is a block diagram showing the resistance change memory according to the first application example.

As shown in FIG. 14, resistance change memory (for example, chip) 1 includes cross-point type memory cell array 2. Cross-point type memory cell array 2 is formed from a stack structure of memory cell arrays.

First control circuit (memory controller) 3 is arranged at one end of cross-point type memory cell array 2 in the first direction. Second control circuit 4 is arranged at one end in the second direction crossing the first direction.

First control circuit 3 and second control circuit 4 select one of stacked memory cell arrays based on, for example, a memory cell array selection signal.

First control circuit 3 selects a row of cross-point type memory cell array 2 based on, for example, a row address signal. Second control circuit 4 selects a column of cross-point type memory cell array 2 based on, for example, a column selection signal.

First control circuit 3 and second control circuit 4 control data write/erase/read for the memory elements in cross-point type memory cell array 2.

First control circuit 3 and second control circuit 4 can perform data write/erase/read for one of the stacked memory cell arrays and can also perform data write/erase/read simultaneously for two or more or all of the stacked memory cell arrays.

In resistance change memory 1, for example, write is called set, and erase is called reset. The resistance value in the set state need only be different from that in the reset state, and whether the resistance value is higher or lower does not matter.

If it is possible to selectively write one of resistance values in the set operation, a multi-level resistance change memory that stores multi-level data in one memory element can be implemented.

Controller 5 supplies control signals and data to resistance change memory 1. The control signals are input to command interface circuit 6. The data are input to data input/output buffer 7. Controller 5 can be arranged in chip 1 or in a host (computer) different from chip 1.

State machine 8 manages the operation of resistance change memory 1 based on command data. For example, state machine 8 manages the set/reset operation and the read operation based on command data from host 5.

Controller 5 can also receive status information managed by state machine 8 and judge an operation result in resistance change memory 1.

In the set/reset operation and the read operation, controller 5 supplies address signals to resistance change memory 1. The address signals include, for example, a memory cell array selection signal, a row address signal, and a column address signal.

The address signals are input to first control circuit 3 and second control circuit 4 via address buffer 9.

Pulse generator 10 outputs a voltage pulse or a current pulse necessary for, for example, the set/reset operation and the read operation at a predetermined timing based on a command from state machine 8. The pulse generator includes a waveform shaping circuit that determines the amplitude, width, period, rise time, fall time, and the like of the voltage pulse or the current pulse in the set operation, reset operation, and read operation.

FIG. 15 illustrates a cross-point type memory cell array.

Cross-point type memory cell array 2 is arranged on semiconductor substrate (for example, silicon substrate) 11. Note that a circuit element such as a MOS transistor or an insulating film may be sandwiched between cross-point type memory cell array 2 and semiconductor substrate 11.

FIG. 15 illustrates an example in which cross-point type memory cell array 2 is formed from four memory cell arrays M1, M2, M3, and M4 stacked in the third direction (a direction perpendicular to the major surface of semiconductor substrate 11). The number of memory cell arrays stacked need only be two or more.

Memory cell array M1 includes cell units CU1 arranged in an array in the first and second directions.

Similarly, memory cell array M2 includes cell units CU2 arranged in an array, memory cell array M3 includes cell units CU3 arranged in an array, and memory cell array M4 includes cell units CU4 arranged in an array.

Each of cell units CU1, CU2, CU3, and CU4 includes a phase change diode memory element according to the above-described embodiment, for example, an SPIS element, an SIPS element, an SMPIS element, or an SIPMS element.

Conductive lines $L1(j-1)$, $L1(j)$, and $L1(j+1)$, conductive lines $L2(i-1)$, $L2(i)$, and $L2(i+1)$, conductive lines $L3(j-1)$, $L3(j)$, and $L3(j+1)$, conductive lines $L4(i-1)$, $L4(i)$, and $L4(i+1)$, and conductive lines $L5(j-1)$, $L5(j)$, and $L5(j+1)$ are arranged on semiconductor substrate 11 in this order from the side of semiconductor substrate 11.

The odd-numbered conductive lines from the side of semiconductor substrate 11, that is, conductive lines $L1(j-1)$, $L1(j)$, and $L1(j+1)$, conductive lines $L3(j-1)$, $L3(j)$, and $L3(j+1)$, and conductive lines $L5(j-1)$, $L5(j)$, and $L5(j+1)$ run in the second direction.

The even-numbered conductive lines from the side of semiconductor substrate 11, that is, conductive lines $L2(i-1)$, $L2(i)$, and $L2(i+1)$ and conductive lines $L4(i-1)$, $L4(i)$, and $L4(i+1)$ run in the first direction.

These conductive lines function as word lines or bit lines.

Lowermost, first memory cell array M1 is arranged between first conductive lines $L1(j-1)$, $L1(j)$, and $L1(j+1)$ and second conductive lines $L2(i-1)$, $L2(i)$, and $L2(i+1)$. In the set/reset operation and the read operation for memory cell array M1, one of the group of conductive lines $L1(j-1)$, $L1(j)$, and L1(j+1) and the group of conductive lines L2(i−1), L2(i), and L2(i+1) functions as word lines, and the other functions as bit lines.

Memory cell array M2 is arranged between second conductive lines L2(i−1), L2(i), and L2(i+1) and third conductive lines L3(j−1), L3(j), and L3(j+1). In the set/reset operation and the read operation for memory cell array M2, one of the group of conductive lines L2(i−1), L2(i), and L2(i+1) and the group of conductive lines L3(j−1), L3(j), and L3(j+1) functions as word lines, and the other functions as bit lines.

Memory cell array M3 is arranged between third conductive lines L3(j−1), L3(j), and L3(j+1) and fourth conductive lines L4(i−1), L4(i), and L4(i+1). In the set/reset operation and the read operation for memory cell array M3, one of the group of conductive lines L3(j−1), L3(j), and L3(j+1) and the group of conductive lines L4(i−1), L4(i), and L4(i+1) functions as word lines, and the other functions as bit lines.

Memory cell array M4 is arranged between fourth conductive lines L4(i−1), L4(i), and L4(i+1) and fifth conductive lines L5(j−1), L5(j), and L5(j+1). In the set/reset operation and the read operation for memory cell array M4, one of the group of conductive lines L4(i−1), L4(i), and L4(i+1) and the group of conductive lines L5(j−1), L5(j), and L5(j+1) functions as word lines, and the other functions as bit lines.

FIG. 16 shows the cell units in two memory cell arrays.

FIG. 16 illustrates, for example, cell units CU1 and CU2 in two memory cell arrays M1 and M2 shown in FIG. 15. In this case, the cell units in two memory cell arrays M3 and M4 shown in FIG. 15 have the same structure as that of the cell units in two memory cell arrays M1 and M2 shown in FIG. 15.

The anode electrode and the cathode electrode of the phase change diode memory element in each of cell units CU1 and CU2 can have a connection relationship in various patterns. However, the connection relationship between the anode electrode and the cathode electrode needs to be the same among all cell units in one memory cell array.

Figure 17:
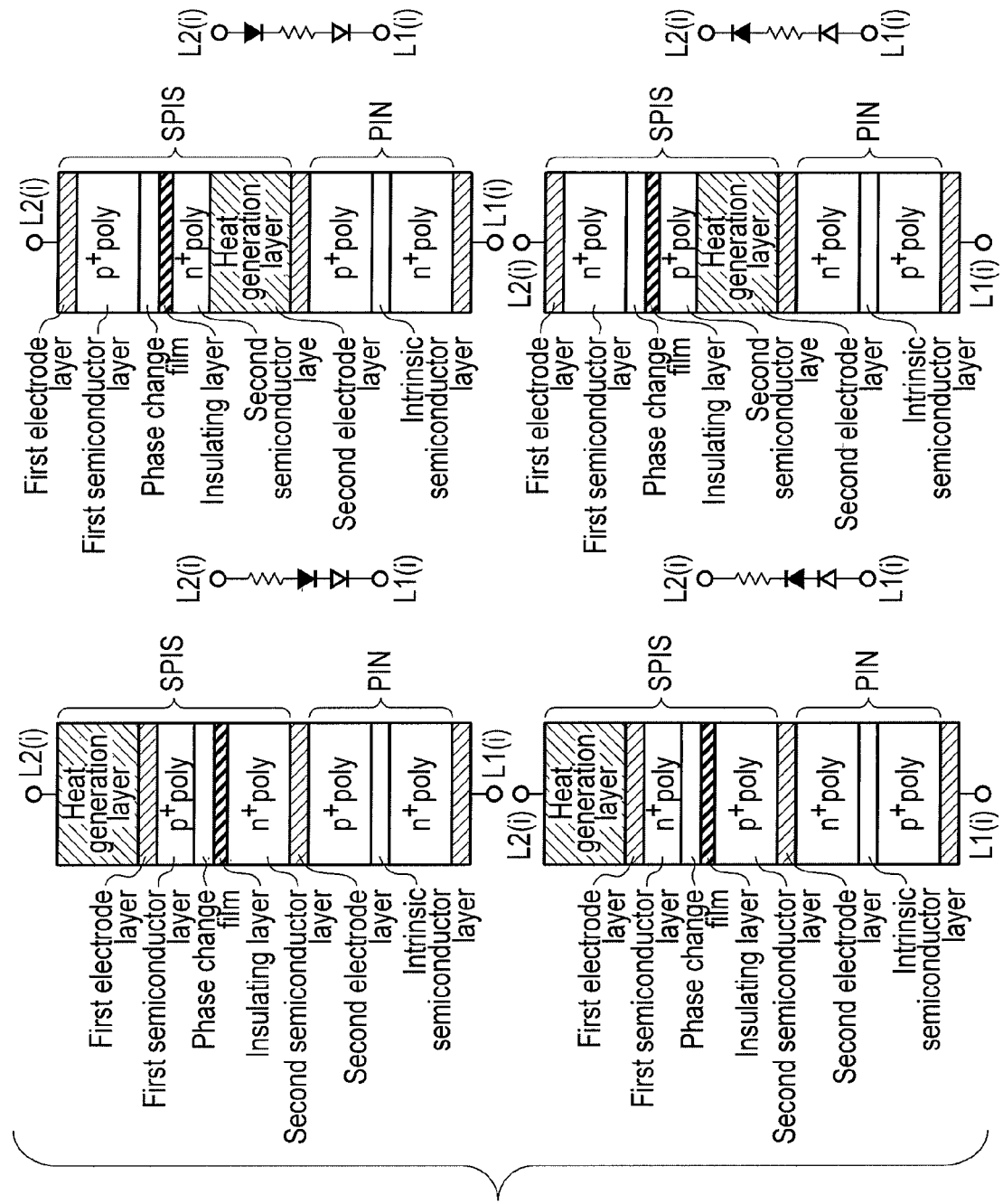
FIG. 17 is a view showing connection relationships between an SPIS element and a rectifying element as an application example of the each embodiment.

FIG. 17 illustrates examples in which the memory cell element of a cell unit is an SPIS element.

As shown in FIG. 17, since there exist two different positions (first electrode side and second electrode side) for the heat generation layer of the SPIS element, and there exist two different polarities (n type and p type) for the semiconductor, there exist at least four different cell unit types.

Figure 19:
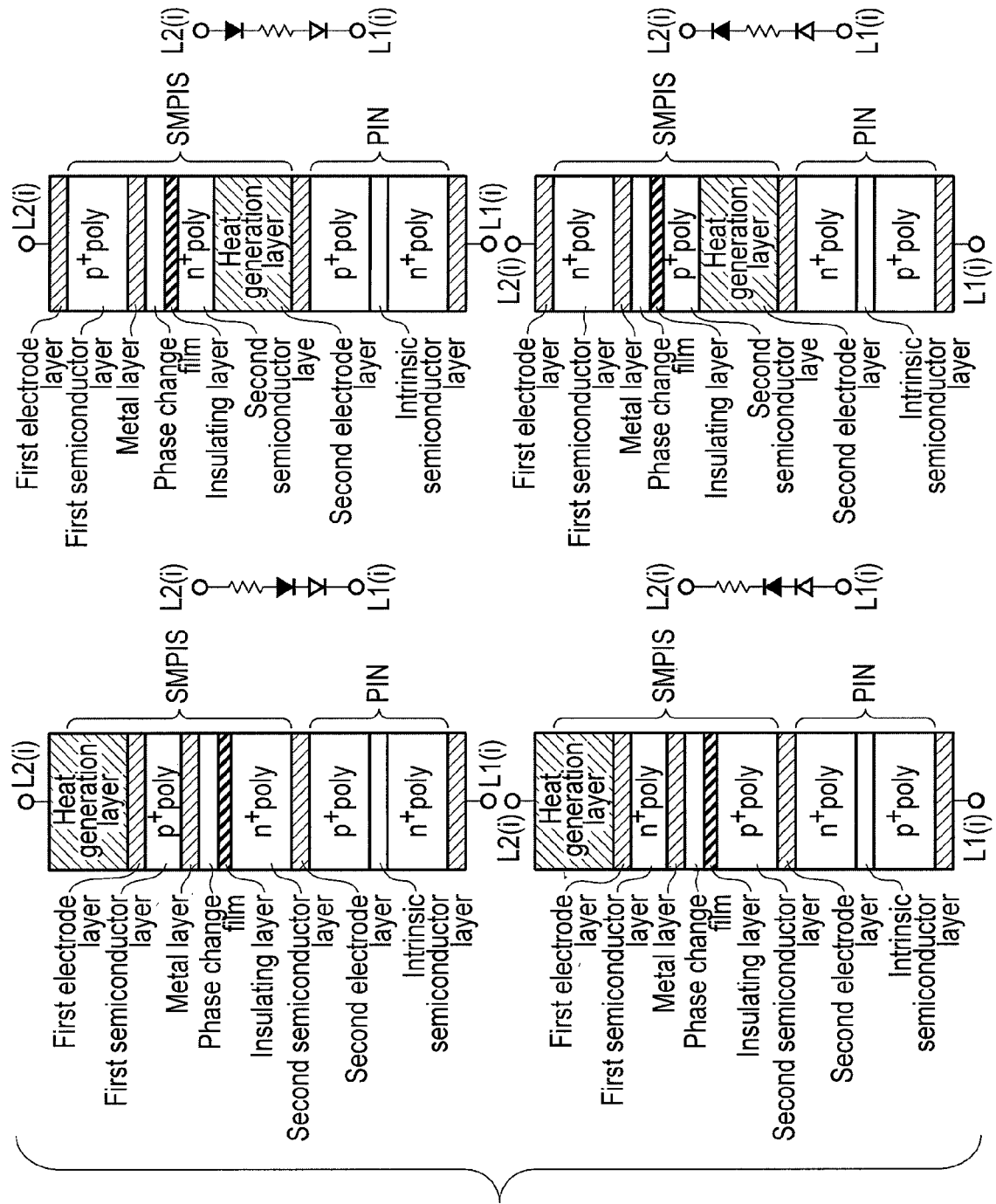
FIG. 19 is a view showing connection relationships between an SMPIS element and a rectifying element as an application example of the each embodiment.
Figure 20:
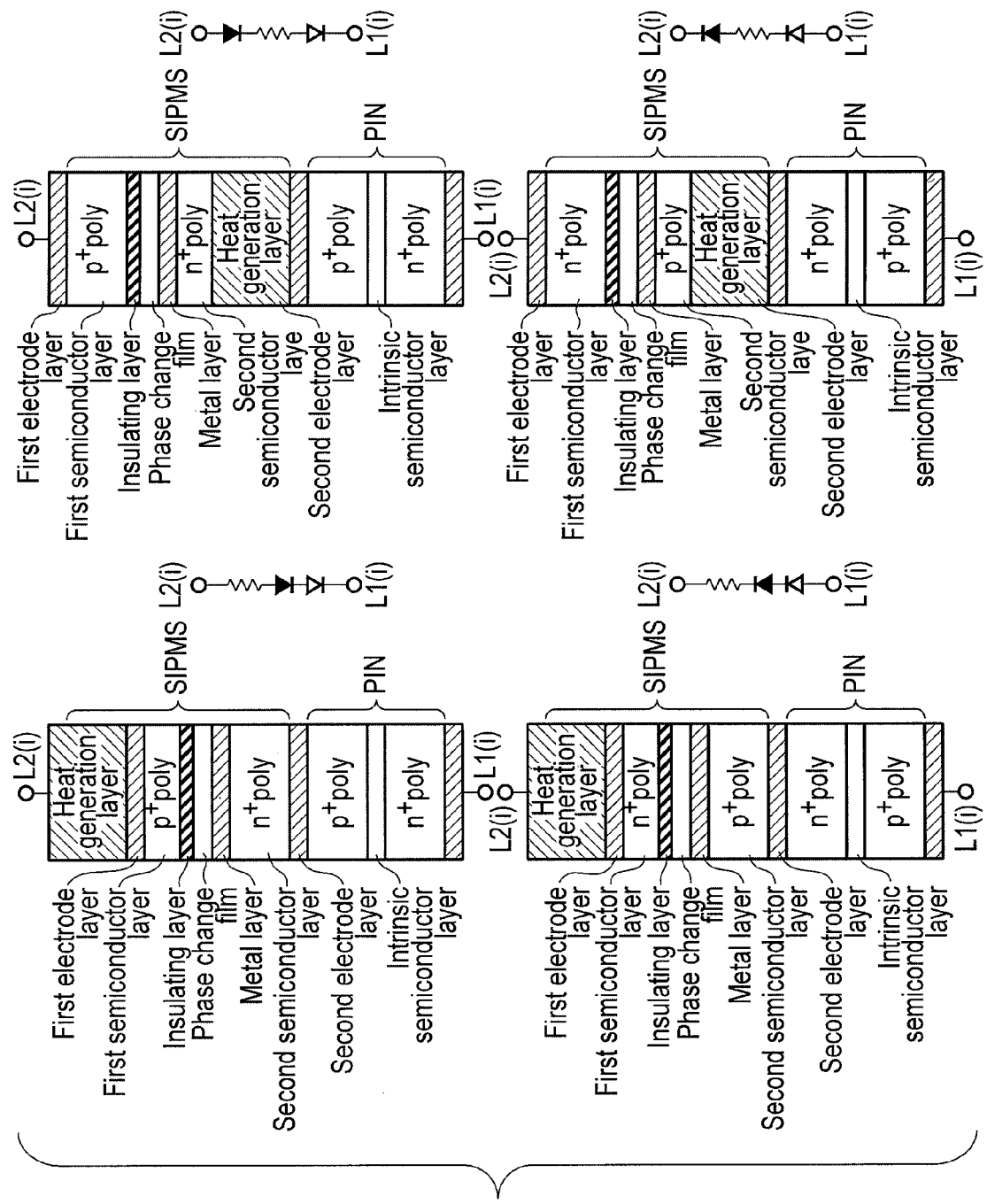
FIG. 20 is a view showing connection relationships between an SIPMS element and a rectifying element as an application example of the each embodiment.

As shown in FIGS. 18, 19 and 20, the cell unit types described for SPIS also exist even for an SIPS element, an SMPIS element, and an SIPMS element.

Figure 21:
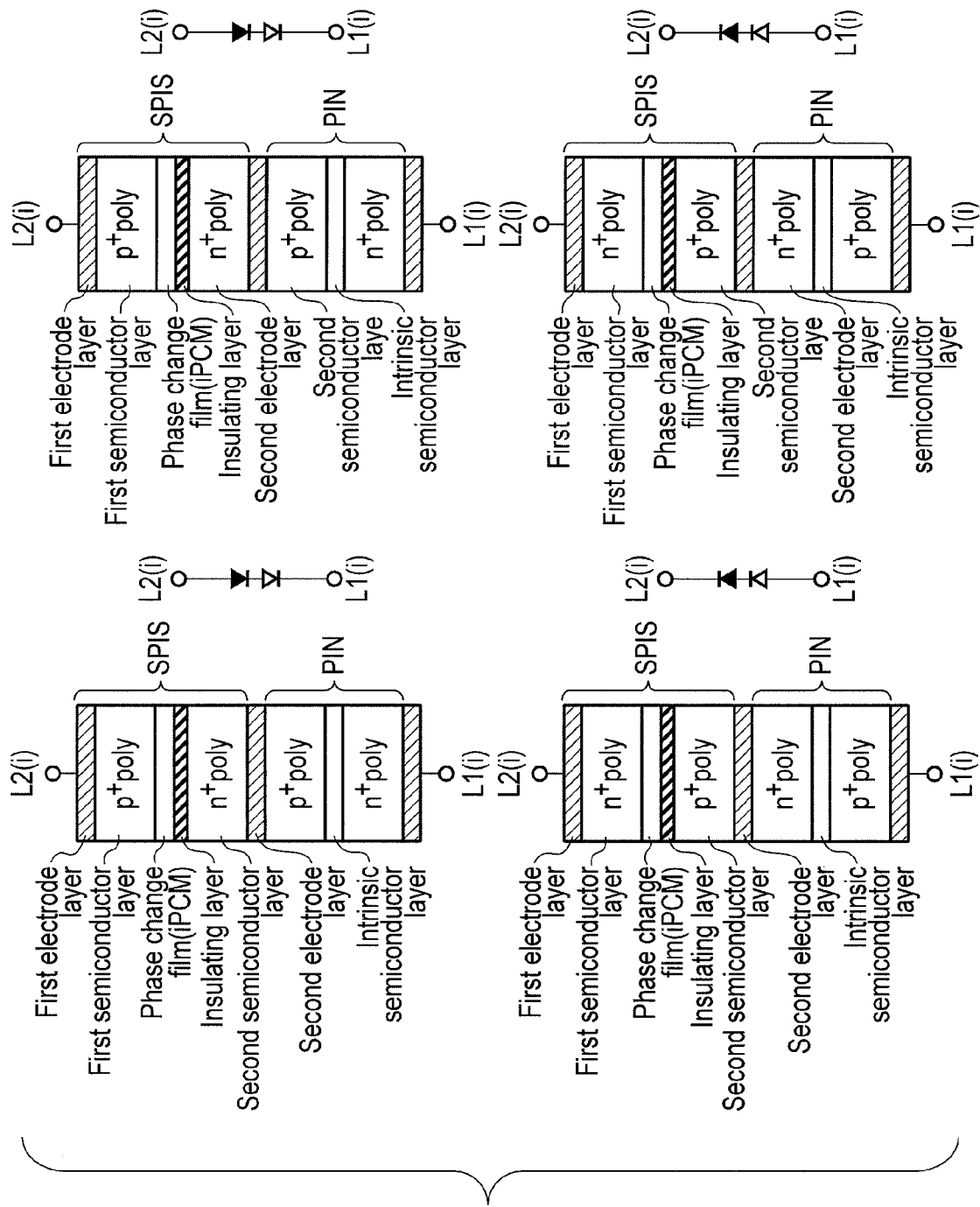
FIG. 21 is a view of a cell unit including an SP (iPCM film) IS element without a heat generation layer as an application example of the each embodiment.

In each of the SPIS element, SIPS element, SMPIS element, and SIPMS element, if the phase change film is an iPCM film, the heat generation layer is not always necessary. As an example, FIGS. 21 and 22 show cell units in which the phase change film is an iPCM film, and the heat generation layer is omitted.

When a current is applied to the iPCM film, the iPCM film phase-changes due to local atom movement only in a specific layer of the iPCM film. That is, since the iPCM film is switched by the current, the phase change occurs without the heat generation layer. Hence, when the iPCM film is used as the phase change film, the heat generation layer is unnecessary. This allows to reduce the aspect ratio of the element, resulting in advantage in microfabrication.

In the cross-point type memory cell array, normally, one cell unit includes a memory element and a selector (rectifying element) which are connected in series. However, according to this embodiment, when the phase change diode memory element has a high rectifying property, the selector can be omitted in all of the above-described connections.

FIGS. 23 and 24 show the layouts of the first control circuit and the second control circuit.

Memory cell array Ms corresponding to one layer of memory cell arrays M1, M2, M3, and M4 shown in FIG. 15 includes cell units CUs arranged in an array, as shown in FIG. 23. One-end terminals of the cell units CUs are connected to conductive lines Ls(j−1), Ls(j), and Ls(j+1), and the other-end terminals are connected to conductive lines Ls+1(i−1), Ls+1(i), and Ls+1(i+1).

Memory cell array Ms+1 includes cell units CUs+1 arranged in an array, as shown in FIG. 24. One-end terminals of the cell units CUs+1 are connected to conductive lines Ls+1(i−1), Ls+1(i), and Ls+1(i+1), and the other-end terminals are connected to conductive lines Ls+2(j−1), Ls+2(j), and Ls+2(j+1).

In this case, s is 1, 3, 5, 7, . . . .

First control circuit 3 is connected to one-end sides of conductive lines Ls+1(i−1), Ls+1(i), and Ls+1(i+1) in the first direction via switch elements SW1. Switch circuits SW1 are formed from, for example, n-channel FETs (Field Effect Transistors) controlled by control signals φs+1(i−1), φs+1(i), and φs+1(i+1).

Second control circuit 4 is connected to one-end sides of conductive lines Ls(j−1), Ls(j), and Ls(j+1) in the second direction via switch elements SW2. Switch circuits SW2 are formed from, for example, n-channel FETs controlled by control signals φs(j−1), φs(j), and φs(j+1).

Second control circuit 4 is connected to one-end sides of conductive lines Ls+2(j−1), Ls+2(j), and Ls+2(j+1) in the second direction via switch elements SW2. Switch circuits SW2 are formed from, for example, n-channel FETs controlled by control signals φs+2(j−1), φs+2(j), and φs+2(j+1).

Second Application Example

Second application example is a modification of the first application example and is different in the following points.

In the first application example, one cell unit is of a 1D1R type in which one diode is connected to one resistance change element. In the second application example, one cell unit is of a 1T1R type in which one transistor is connected to one resistance change element. The remaining points are the same as in the first application example, and a detailed description thereof will be omitted.

Figure 25:
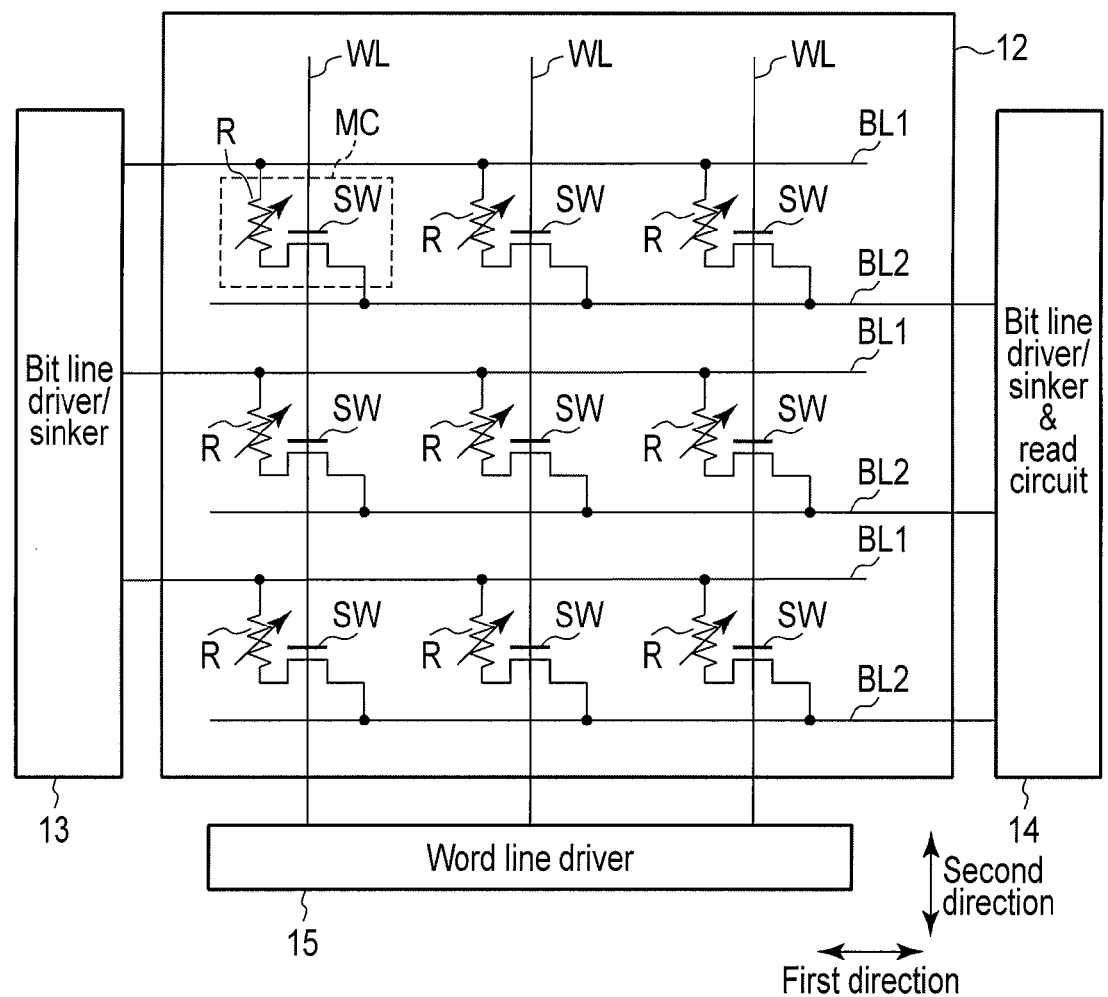
FIG. 25 is a block diagram showing a 1T1R type memory cell array as an application example of the each embodiment.

FIG. 25 illustrates a memory cell array in which 1T1R type cell units are arranged.

Memory cell array 12 includes cell units MC arranged in an array. One cell unit MC includes one resistance change element R and one select transistor (FET) SW.

The resistance change element is a phase change diode memory element, and the type is the same as in the first application example.

The resistance change element R and the select transistor SW are connected in series and have one terminal connected to first bit line BL1 and the other terminal connected to second bit line BL2. The control terminal (gate terminal) of select transistor SW is connected to word line WL that runs in the second direction.

First bit line BL1 runs in the first direction and has one end connected to bit line driver/sinker 13. Second bit line BL2 runs in the first direction and has one end connected to bit line driver/sinker & read circuit 14.

However, the arrangement may be modified so as to connect first bit line BL1 to bit line driver/sinker & read circuit 14 and second bit line BL2 to bit line driver/sinker 13.

The positions of bit line driver/sinker 13 and bit line driver/sinker & read circuit 14 may be reversed, or they may be arranged at the same position.

Word line WL runs in the second direction and has one end connected to word line driver 15.

FIG. 26 shows an example of 1T1R type cell unit MC.

Select transistor SW is arranged in active area AA of semiconductor substrate 16. Active area AA is surrounded by element isolation insulating layer 17 in semiconductor substrate 16. In the second application example, element isolation insulating layer 17 has an STI (Shallow Trench Isolation) structure.

Select transistor SW includes source/drain diffusion layers 18a and 18b in semiconductor substrate 16, gate insulating layer 19 on the channel between them, and gate electrode 20 on gate insulating layer 19. Gate electrode 20 functions as word line WL.

Interlayer dielectric film 21 covers select transistor SW. The upper surface of interlayer dielectric film 21 is flat. Lower electrode 22 that is one of the first electrode layer and the second electrode layer is arranged on interlayer dielectric film 21. Lower electrode 22 is connected to source/drain diffusion layer 18b of select transistor SW through contact plug 23.

Resistance change element R is arranged on lower electrode 22.

For example, when resistance change element R is an SPIS element, a first semiconductor layer (S1), a phase change film (P) on the first semiconductor layer, an electrical insulating layer (I) on the phase change film, and a second semiconductor layer (S2) are stacked on lower electrode 22 in this order.

Upper electrode 24 that is one of the first electrode layer and the second electrode layer is arranged on resistance change element R. Upper electrode 24 functions as, for example, a hard mask when processing resistance change element R.

In addition, an SiN liner (PL) made of SiN is formed on the side surface of each resistance change element R for the purpose of protecting the side wall of resistance change element R.

Interlayer dielectric film 25 covers resistance change element R. The upper surface of interlayer dielectric film 25 is flat. First bit line BL1 and second bit line BL2 are arranged on interlayer dielectric film 25. First bit line BL1 is connected to upper electrode 24. Second bit line BL2 is connected to source/drain diffusion layer 18a of select transistor SW through contact plug 26.

Other than the structure described in the above embodiment, an SIPS element, an SMPIS element, and an SIPMS element are possible.

One of lower electrode 22 and upper electrode 24 functions as the heat generation layer. However, when the phase change film is formed from an iPCM film, the heat generation layer can be omitted.

Third Application Example

Third application example is a modification of the first application example and the second application example and is different in the following points.

A cell unit of the third application example has a NAND string structure used in a NAND flash memory and is advantageous in integrating the resistance change element. In the third application example, a phase change diode memory element is formed on a tunnel insulating film as resistance change element R. The remaining points are the same as in the first application example, and a detailed description thereof will be omitted.

Figure 27:
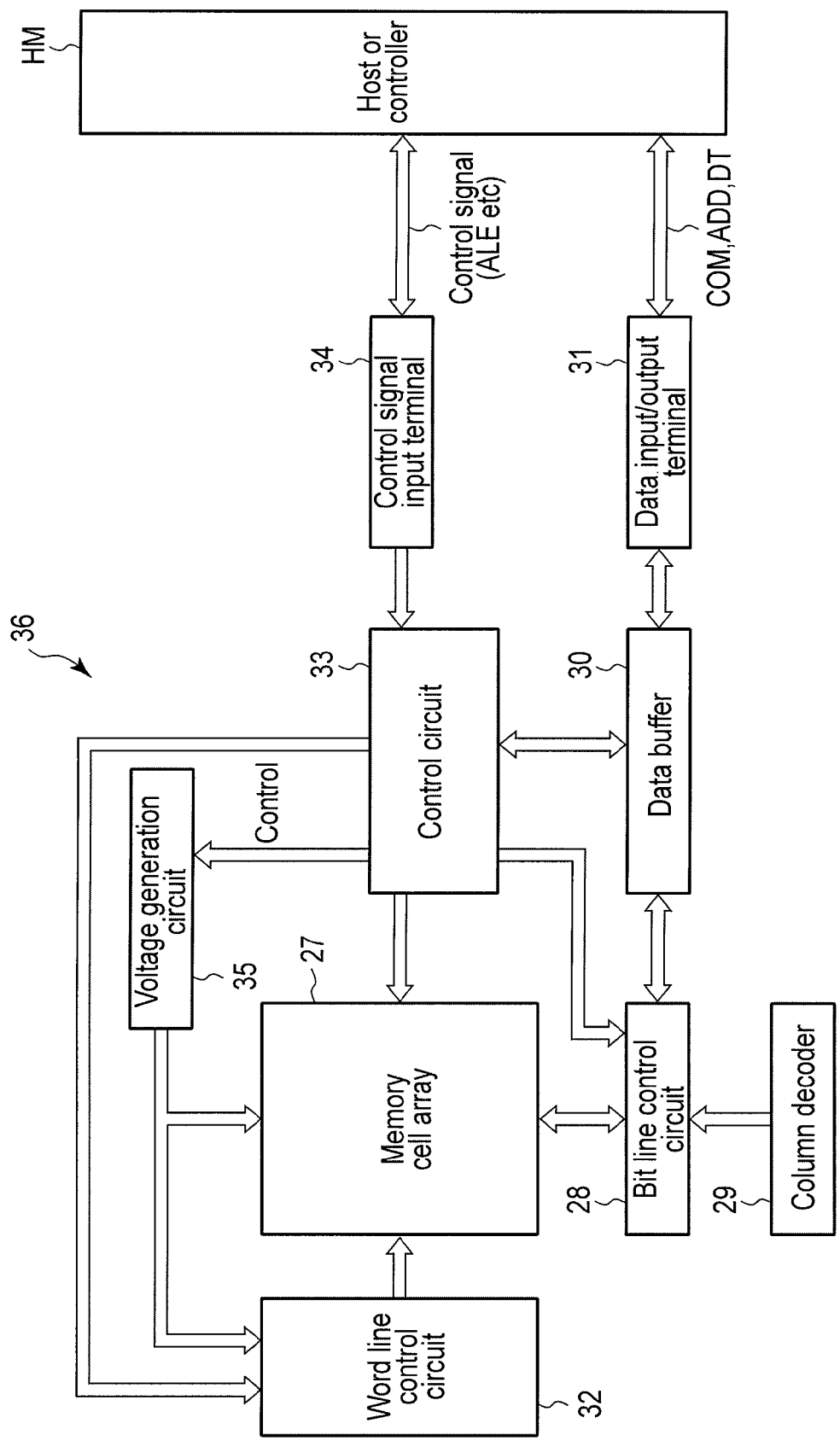
FIG. 27 is a block diagram showing a NAND type resistance change memory as an application example of the each embodiment.

FIG. 27 is a block diagram showing a NAND type resistance change memory.

As shown in FIG. 27, NAND type resistance change memory 36 includes memory cell array 27, bit line control circuit 28, column decoder 29, data buffer 30, data input/output terminal 31, word line control circuit 32, control circuit 33, control signal input terminal 34, and voltage generation circuit 35. Memory cell array 27 includes blocks. Each block includes memory cells, word lines, bit lines, and the like. The block includes pages each including memory cells. Details will be described later. Memory cell array 27 is electrically connected to bit line control circuit 28, word line control circuit 32, control circuit 33, and voltage generation circuit 35.

Bit line control circuit 28 reads data of a cell unit in memory cell array 27 through a bit line and detects the state of the memory cell through the bit line. Bit line control circuit 28 also writes (programs) data in a memory cell by applying a write (program) voltage to the memory cell in memory cell array 27 through a bit line. Column decoder 29, data buffer 30, and control circuit 33 are electrically connected to bit line control circuit 28.

Bit line control circuit 28 includes a sense amplifier, a data storage circuit, and the like (not shown). Column decoder 29 selects a specific data storage circuit. Data of a memory cell read to the selected data storage circuit is externally output out of the memory from data input/output terminal 31 via data buffer 30. Data input/output terminal 31 is connected to a device (for example, a host, a memory controller, or the like) outside the memory. Data input/output terminal 31 receives various kinds of commands COM to control the operation of resistance change memory 36 or addresses ADD from the host or memory controller HM, receives data DT, or outputs data DT to the host or memory controller HM. Write data DT input to data input/output terminal 31 is supplied via data buffer 30 to the data storage circuit selected by column decoder 29. Command COM and address ADD are supplied to control circuit 33. The sense amplifier amplifies the potential on a bit line.

Word line control circuit 32 selects a specific word line in memory cell array 27 under the control of control circuit 33. Word line control circuit 32 receives a voltage necessary for read, write, or erase from voltage generation circuit 35. Word line control circuit 32 applies the voltage to the selected word line.

Control circuit 33 is electrically connected to memory cell array 27, bit line control circuit 28, column decoder 29, data buffer 30, word line control circuit 32, and voltage generation circuit 35 and controls them. Control circuit 33 is connected to control signal input terminal 34 and controlled by a control signal such as an ALE (Address Latch Enable) signal input from outside via control signal input terminal 34. Control circuit 33 also outputs a control signal to voltage generation circuit 35 and controls it.

Voltage generation circuit 35 applies a necessary voltage to memory cell array 27, word line control circuit 32, and the like in each operation such as write, read, or erase under the control of control circuit 33. Voltage generation circuit 35 is configured to be able to generate such various kinds of voltages. More specifically, voltage generation circuit 35 generates, for example, voltage VREAD at the time of data read, voltages VPGM, VPASS, and VISO at the time of data write, and voltage VERA at the time of data erase.

Figure 28:
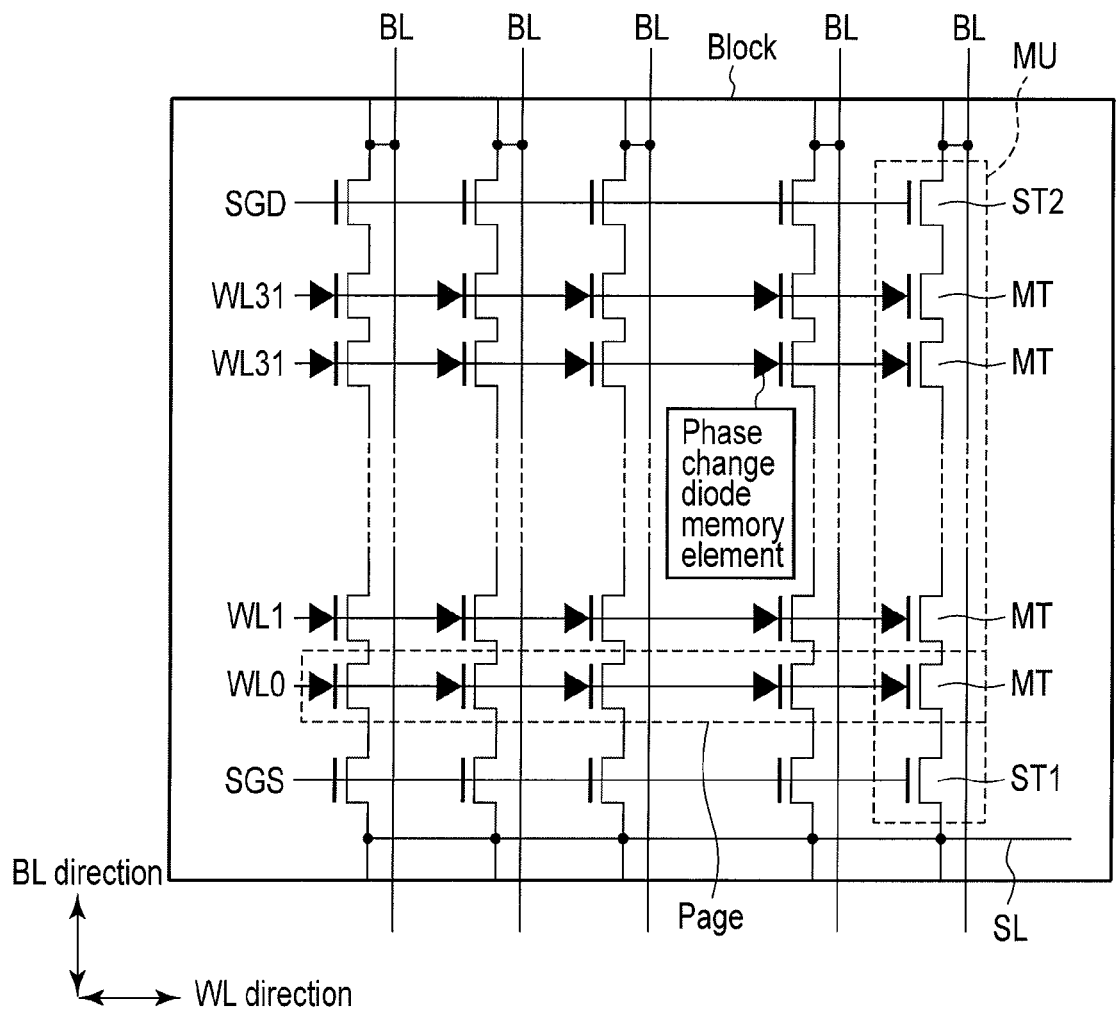
FIG. 28 is a circuit diagram showing an example of a Block of the NAND type resistance change memory as an application example of the each embodiment.

FIGS. 28 and 29 are a circuit diagram and a sectional view, respectively, showing an example of a block Block of the NAND type resistance change memory. FIG. 28 illustrates only one block Block. As shown in FIGS. 28 and 29, block Block includes memory cell strings (memory cell units) MU arranged along the word line direction (WL_direction). Memory cell strings MU run in the bit line direction (BL_direction). Each memory cell string MU is formed from a NAND string and select transistors "ST1 and ST2". The NAND string is formed from (for example, 32) memory cell transistors MT whose current paths (sources/drains SD) are connected in series with each other.

Memory cell transistor MT includes a phase change diode memory element.

Select transistors "ST1 and ST2" are connected to the two ends of the NAND string, respectively. The other end of the current path of select transistor "ST2" is connected to bit line BL, and the other end of the current path of select transistor "ST1" is connected to source line SL.

Each of word lines WL0 to WL31 runs in the WL direction and is connected to memory cell transistors MT belonging to the same row. Select gate line SGD runs along the WL direction and is connected to all select transistors "ST2" in the block. Select gate line SGS runs along the WL direction and is connected to all select transistors "ST1" in the block.

A group of memory cell transistors MT connected to the same word line WL forms a page. Data is read or written on the page basis. In a multi-level memory cell capable of retaining data of bits in one memory cell, pages are assigned to one word line. Note that data erase is done on the block basis.

Memory cell transistor MT is provided at each intersection between bit lines BL and word lines WL. Memory cell transistor MT is provided on a well formed in a semiconductor substrate. Memory cell transistor MT includes a tunnel insulating film (not shown) stacked on the well, a phase change diode memory element, control electrode (control gate electrode) CG (word line WL), and source/drain regions SD. Source/drain "regions SD" corresponding to the current path of memory cell transistor MT are connected in series with source/drain "regions SD" of adjacent memory cell transistor MT. Each of select transistors "ST1 and ST2" includes a gate insulating film (not shown) stacked on the semiconductor substrate, gate electrodes SGS and SGD, and source/drain regions SD.

The phase change diode memory element used in memory cell transistor MT is the same as in the first application example or the second application example. The electrode layer on the side in contact with the tunnel insulating film may be omitted. When an iPCM film is used as the phase change film, the heat generation layer is not always necessary because the iPCM film is switched by a current.

As described above, according to the first to third application examples, the resistance change memory that uses a phase change diode memory element as a resistance change element features a sufficient ON/OFF ratio, high-speed write (record) and erase, a high rewrite durability, a high data retention characteristic, and low power consumption based on a low-current operation, and is therefore suitable for element microfabrication than a general nonvolatile semiconductor memory device.

Manufacturing Method

As an example of a manufacturing method, a manufacturing method associated with the second application example will be described.

Select transistor SW that selects resistance change element R connected to word line WL is formed. A via is formed in the source/drain diffusion layer of select transistor SW. A first electrode layer (tungsten: W) also serving as a heat generation layer is buried. Planarization is performed to expose the surface of the first electrode layer. After that, a first semiconductor layer mainly containing Si, a phase change film, an electrical insulating layer mainly containing $SiO_2$, a second semiconductor layer mainly containing Si, and a second electrode layer (stacked film of TiN/W) are stacked in this order. The first semiconductor layer and the second semiconductor layer are doped with P or As and B, respectively. A collective process is performed by dry etching to form pillars (pillar element group) of resistance change elements R each having an element size of 40 [nmφ]. An SiN liner (PL) made of SiN is formed on the side surface of each resistance change element R for the purpose of protecting the side wall of resistance change element R. The interlayer regions are filled with an insulating film of $SiO_2$. Finally, planarization is performed to expose the surface of the second electrode layer (stacked film of TiN/W). After that, bit lines are formed.

The first semiconductor layer and the second semiconductor layer are obtained by depositing Poly-Si. Annealing is performed after or during formation of resistance change element R, thereby increasing the crystallinity. Various kinds of annealing methods are applicable. Laser annealing, microwave annealing, and the like can be performed at a relatively low temperature. When the first semiconductor layer and the second semiconductor layer are formed using MILC (Metal Induced Lateral Crystallization), the annealing temperature can be kept low. Note that in many cases, the melting point of the phase change film is about 600 to 700[° C.]. If annealing is performed at a relatively high temperature after formation of the second semiconductor layer, the elements may diffuse from the phase change film to the first semiconductor layer. When using an annealing process at a relatively high temperature, a very thin insulating layer is preferably inserted as a diffusion barrier layer between the phase change film and the first semiconductor layer. The film thickness of the diffusion barrier layer is preferably 0.5 to 2 [nm]. As the diffusion barrier layer, $ZrO_2$, $Cr_2O_3$, $Ta_2O_5$, or the like is usable. In a structure in which a metal layer is inserted between the phase change film and the semiconductor layer, for example, in an SMPIS element or SIPMS element, the metal layer functions as a diffusion barrier. Hence, the diffusion barrier layer can be omitted. Note that when a diffusion barrier layer is inserted into the SMPIS element or SIPMS element, the diffusion barrier layer is preferably inserted between the phase change film and the metal layer.

As the second electrode layer, TiN is used. Connection to the bit line (BL) is done using W. For this reason, the second electrode layer is formed from a stacked film of TiN and W. Note that TiN is also inserted into the interface between the select transistor and the first electrode layer.

CONCLUSION

According to the embodiment, the memory features a high recording density, a sufficient ON/OFF ratio, high-speed write(record) and erase, a high rewrite durability, a high data retention characteristic, and low power consumption based on a low-current operation, and is therefore suitable for element microfabrication than a general nonvolatile semiconductor memory device. It is also possible to provide a resistance change memory capable of multi-level recording.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a memory cell which stores data with two or more levels,
wherein the memory cell includes a structure comprising a first electrode layer, a first semiconductor layer, a phase change film, an electrical insulating layer, a second semiconductor layer, and a second electrode layer arranged in order thereof, and
the first semiconductor layer and the second semiconductor layer have carrier polarities different from each other.

2. The memory of claim 1, further comprising a metal layer between the first semiconductor layer and the phase change film.

3. The memory of claim 1, wherein the electrical insulating layer mainly contains a material selected from the group consisting of $SiO_2$, $AL_2O_3$, and SiN.

4. The memory of claim 1, wherein the phase change film includes one of GeTe, SnTe, AlTe, GeSbTe, GeBiTe, GeSbSnTe, GeSbBiTe, GeInTe, GeSbInTe, GeBiInTe, GeSnTe, CuSbTe, GeSb, GaSb, a stacked film of GeTe and $Sb_2Te_3$, and a stacked film of AlTe and $Sb_2Te_3$.

5. The memory of claim 3, wherein the electrical insulating layer has an EOT of 0.5 to 3 [nm].

6. The memory of claim 4, wherein a film thickness of the phase change film is 1 to 40 [nm].

7. The memory of claim 1, wherein each of the first semiconductor layer and the second semiconductor layer is a semiconductor mainly containing Si and having a film thickness of 10 to 30 [nm].

8. The memory of claim 7, wherein an impurity concentration of the first semiconductor layer and the second semiconductor layer is $1 \times 10^{20}$ to $1 \times 10^{21}$ [cm$^{-3}$].

9. The memory of claim 1, wherein the phase change film has a stacked structure.

10. The memory of claim 1, wherein the phase change film has a superlattice structure (iPCM).

11. The memory of claim 1, wherein the electrical insulating layer has a stacked structure of $Al_2O_3$ and SiN.

12. The memory of claim 1, wherein the electrical insulating layer has a stacked structure of $Al_2O_3$ and $SiO_2$.

13. The memory of claim 1, further comprising an insulating layer as a diffusion barrier layer containing one material selected from the group consisting of $ZrO_2$, $Cr_2O_3$, and $Ta_2O_5$, having a film thickness of 0.5 to 2 [nm], and being in contact with the phase change film.

14. The memory of claim 1, wherein one of the first electrode layer and the second electrode layer comprises a heat generation layer.

15. The memory of claim 1, wherein the data is stored in accordance with a state of the phase change film and read by detecting a change in a voltage/current characteristic between the first electrode layer and the second electrode layer caused by the state.

16. The memory of claim 1, wherein the memory cell also functions as a rectifying element.

17. The memory of claim 1, further comprising a rectifying element arranged adjacent to one of the first electrode layer and the second electrode layer.

18. The memory of claim 1, further comprising a word line and a bit line which cross each other,
wherein the memory cell is connected between the word line and the bit line.

19. The memory of claim 1, further comprising a select transistor connected in series with the memory cell.

20. The memory of claim 1, wherein the memory cell comprises an FET including a control gate electrode on the structure.

* * * * *